US 6,531,662 B1

(12) United States Patent
Nakamura

(10) Patent No.: US 6,531,662 B1
(45) Date of Patent: Mar. 11, 2003

(54) CIRCUIT BOARD, BATTERY PACK, AND METHOD OF MANUFACTURING CIRCUIT BOARD

(75) Inventor: Satoshi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/959,362

(22) PCT Filed: Apr. 19, 2000

(86) PCT No.: PCT/JP00/02571

§ 371 (c)(1),
(2), (4) Date: Oct. 19, 2001

(87) PCT Pub. No.: WO00/65888

PCT Pub. Date: Nov. 2, 2000

(30) Foreign Application Priority Data

| Apr. 22, 1999 | (JP) | ................................ 11-114614 |
| Aug. 19, 1999 | (JP) | ................................ 11-232452 |
| Aug. 31, 1999 | (JP) | ................................ 11-245483 |
| Sep. 3, 1999 | (JP) | ................................ 11-249538 |

(51) Int. Cl.$^7$ .................................................. H05K 1/02
(52) U.S. Cl. ........................ 174/255; 174/254; 174/259; 361/776
(58) Field of Search ................................ 174/255, 254, 174/259; 361/784, 803, 749, 750, 751, 792, 776; 439/493

(56) References Cited

U.S. PATENT DOCUMENTS

| 4,845,479 A | * | 7/1989 | Marincic ..................... 345/17 |
| 5,452,182 A | * | 9/1995 | Eichelberger et al. ...... 361/749 |
| 5,548,087 A | | 8/1996 | Dahringer .................. 174/52.4 |
| 5,917,707 A | * | 6/1999 | Khandros et al. ........... 361/776 |
| 6,183,104 B1 | * | 2/2001 | Ferrara ........................ 361/145 |

FOREIGN PATENT DOCUMENTS

| JP | 05-275821 | 10/1993 | ............ H05K/1/14 |
| JP | 06-268348 | 9/1994 | ............ H05K/1/14 |
| JP | 06-314866 | 11/1994 | ............ H05K/1/14 |
| JP | 11-087874 | 3/1999 | ............ H05K/1/14 |

* cited by examiner

Primary Examiner—Albert W. Paladini
(74) Attorney, Agent, or Firm—Michael D. Bednarek; Shaw Pittman LLP

(57) ABSTRACT

A circuit substrate (10) comprises a first substrate split (11) formed with a predetermined wiring pattern (16) and a second substrate split (12) formed with a predetermined wiring pattern (17). The substrate splits are electrically and/or mechanically joined together, and the circuit substrate is bent at the joint. The joint is provided by a bendable joint member (13) including a plurality of leads (14) disposed in parallel and held by a thin piece of base film (20) integrally therewith. The joint member is attached to interconnect the first and the second substrate splits (11, 12).

21 Claims, 16 Drawing Sheets

CIRCUIT BOARD, BATTERY PACK, AND METHOD OF MANUFACTURING CIRCUIT BOARD

TECHNICAL FIELD

The present invention relates to a circuit substrate suitably incorporated in a battery pack and the like in a laptop personal computer, a mobile phone and so on. The present invention also relates to a battery pack incorporating such a circuit substrate. Further, the present invention relates to a method of manufacturing such a circuit substrate.

BACKGROUND ART

For a laptop personal computer for example, a battery pack is available which utilizes a lithium ion battery, or a manganese battery for example. Such a battery pack is detachable from the personal computer itself.

As shown in FIG. 29, a common battery pack P comprises a case 1 and a plurality of batteries 2 encased therein. The case 1 incorporates a circuit substrate 10 including a printed circuit mounted with a connector C and other electronic parts (not illustrated). The circuit substrate 10 serves for battery power supply and electric signal exchange between the batteries 2 and external components. The battery pack P is under a certain limitation in terms of the size of case 1, making it difficult to provide a large internal space other than for the batteries 2. For this reason, the circuit substrate 10 is incorporated as a first and a second substrate splits 11, 12. With this arrangement, the first and the second substrate splits 11, 12 are joined with each other by a joint structure to be described hereafter, and bent at the joint not shown in FIG. 29.

FIG. 30 through FIG. 32 show conventional joint structures between the first and the second substrate splits. According to the joint structure shown in FIG. 30, a first substrate split 111 and a second substrate split 121 are joined together via a plurality of lead wires R. Each of the lead wires R is bonded to wiring patterns P111, P121 provided on respective surfaces of the substrate splits 111, 121. The lead wires R can be bent easily. The substrate splits 111, 121 are electrically interconnected via the lead wires R. The circuit substrate thus provided by the substrate splits 111, 121 and joined by the above joint structure includes a connector C, electronic parts D and so on, yet the circuit substrate can be incorporated into the case 1 through effective use of an internal space not occupied by the batteries 2.

According to the joint structure shown in FIG. 31, a first and a second substrate splits 112, 122 are joined together via an intermediate member 200. The substrate splits 112, 122 are each provided by a multi-layer substrate having through holes (not illustrated). When making this joint structure, first, the intermediate member 200 is made from a flexible film material 200a by forming thereon with a conductive pattern 200b. Then, after various steps of manufacture, finally, two ends of the intermediate member 200 are sandwiched by respective pairs of rigid members 112a, 112b, 122a, 122b, to obtain the circuit substrate as shown in FIG. 31. Thus, according to the circuit substrate in FIG. 31, the intermediate member 200 is exposed at the joint. The circuit substrate can be easily bent at this exposed portion. Therefore, the joint structure according to Conventional Example 2 offers the same advantage as achieved by the previous Conventional Example 1.

Further, according to a joint structure shown in FIG. 32, the circuit substrate can be made through manufacturing steps simpler than those for the conventional examples shown in FIG. 30 and FIG. 31. Specifically, a first and a second substrate splits 113, 123 are joined together and electrically interconnected with each other, simply via metal strips 300, 310. The circuit substrate can be bent into a desired shape by bending the metal strips 300, 310.

Now, the circuit substrate with any of the above conventional joint structures has a problem to be described below. Specifically, in the circuit substrate with the joint structure shown in FIG. 30, the lead wires R that serve as joint parts are short and very fine, which makes it difficult to handle by a manufacturing machine. Therefore, according to this circuit substrate, the lead wires R can be attached to the connecting region only by manual operation. With this circuit substrate, it is difficult to improve productivity through factory automation for example.

According to the joint structure shown in FIG. 31, it is anticipated that manufacturing process can be automated. However, this joint structure is complex in that the circuit substrate that includes the substrate splits 112, 122 and the intermediate member 200 has a multi-layer structure. Therefore, this circuit substrate requires a large number of manufacturing steps, leading to increase in the cost of circuit substrate itself.

According to the joint structure shown in FIG. 32, it is possible to bend the metal strips 300, 310. However, this joint structure does not allow the joint to be flexibly bent as the circuit substrate is being shaped for appropriate fitting into the case 1 of the battery pack P. Therefore, with this joint structure, operation of incorporating the circuit substrate cannot be efficient, requiring a laborious procedure. Furthermore, the joint structure offers no such protection to the metal strips 300, 310 as electrical insulation and resistance to heat, posing another problem of low reliability in electrical continuity.

DISCLOSURE OF THE INVENTION

An object of the present invention is to provide a circuit substrate capable of eliminating or at least reducing the problems described above.

Another object of the present invention is to provide a battery pack incorporating such a circuit substrate.

Another object of the present invention is to provide a method of manufacturing such a circuit substrate.

A circuit substrate provided by a first aspect of the present invention comprises:

a first substrate split formed with a predetermined wiring pattern and a second substrate split formed with a predetermined wiring pattern. The substrate splits are electrically and/or mechanically joined together, and the circuit substrate is bendable at the joint.

The joint is provided by a bendable joint member including a plurality of leads disposed in parallel and held by a thin piece of base film integrally therewith. The joint member is attached to the first and the second substrate splits.

According to a preferred embodiment of the present invention, the first and the second substrate splits are electrically interconnected via the leads.

Preferably, the first and the second substrate splits are rigid printed wiring substrates.

According to the above arrangement, the joint member is provided by a plurality of leads held by the base film integrally therewith. The joint member is provided with electrical insulation, heat resistance and so on by the base film. Therefore, the joint member serves as a reliable electrical conductor. Further, the joint member is provided with a certain level of stiffness by the leads. The joint member is attached as the joint at a joint portion between the first and the second substrate splits. Therefore, the joint member can be handled easily by automated machinery, making possible to improve productivity through automation.

Further, the first and the second substrate splits can be provided by a simple substrate having one or two surfaces each formed with a wiring pattern. The joint member can be manufactured separately from the substrate splits, and then attached to the substrate splits. Therefore, each step of manufacturing the first and the second substrate splits as well as steps of manufacturing the joint member can be simple. Further, the joint member enables to reduce the number of parts and materials necessary for the circuit substrate as a whole, and to reduce product cost of the circuit substrate as a whole. Further, the joint member has a certain level of stiffness provided by the leads. The joint member is flexibly bendable because of the thin piece of base film. Therefore, the circuit substrate can be efficiently fitted into e.g. a case while being bent flexibly at the joint provided by the joint member.

According to a preferred embodiment of the present invention, the leads are shaped in a gull wing pattern. The attachment of the joint member is provided by each of the leads having its two ends connected to predetermined places respectively of the substrate splits.

With the above arrangement, the joint member as a whole is shaped into the gull wing pattern along the length of the leads, into a shape similar to a packaged semiconductor chip. Therefore, according to the above arrangement, the joint member can be reliably bonded at its connecting points, by using an automatic machine such as a chip mounter. Also, according to the above arrangement, it is easy to automate the connecting operation while maintaining reliability in the electrical connection.

According to a preferred embodiment of the present invention, the leads in mutual adjacency are separated from each other at a predetermined interval by a retainer formed between the leads.

With the above arrangement, the leads disposed in parallel to each other are sandwiched by films from above and below. Under the sandwiched state, mutually adjacent leads are retained at a predetermined distance from each other by the retainer formed between the leads. Therefore, according to the above arrangement, it becomes possible to electrically insulate the mutually adjacent leads from each other. Further it becomes possible to prevent the leads from short-circuiting, and to keep a reliable circuit operation.

Preferably, the base film includes a tape layer and an adhesive bonding layer formed on a lower surface of the tape layer.

The bonding layer is thermally melted to fill space between the leads and then is set, thereby formed as the retainer.

With the above arrangement, when the leads are sandwiched between the films, since the film is formed with a thermo-melting bonding layer, even if the gap between the leads is very small, it is possible to fill the gap with the bonding layer, without leaving air gap between the leads. Therefore, the films can be favorably pasted to each of the leads via the bonding layer. The bonding layer enables to retain the leads firmly in mutual adjacency. The bonding layer is preferably provided by e.g. a silicone adhesive or an epoxy adhesive.

According to a preferred embodiment of the present invention, the lead has its end portions, except end faces, soldered to terminals of the substrate splits.

With the above arrangement, when the substrate splits are interconnected by the joint member, the bonding is provided by the end portions of the leads, except the end faces, of the joint member which are fixed by the solder thereby connected to corresponding terminal portions of the substrate splits. For example, if the joint member is part of a tie bar during the manufacture, the lead is finally cut off the tie bar when the tie bar becomes unnecessary. If the soldering is performed while the cut faces are left exposed, solder fillet is not formed favorably. However, if the soldering is performed to the end portion except the end faces, i.e. the cut faces, solder fillet is formed appropriately along side surfaces of the lead. The above arrangement enables favorable and firm bonding between the lead and the terminal portions of the substrate splits.

Preferably, the lead has end portions bent, with the end faces oriented generally upward.

With the above arrangement, in order to solder the end portion of the lead except the end face, to the terminal portion of the substrate split, the end portion of the lead should simply be bent to turn the end face generally upward.

Preferably, the lead is formed with a portion narrower than the other portion of the lead, for bending.

With the above arrangement, the formation of the narrow portion in the lead reduces stress when the lead is bent in a pressing process, and therefore the lead can bend easily. Thus, it becomes possible to reduce such a problem as caused during the solder re-flow operation, that the angle of bending is increased due to softening of the base film. It also becomes possible to prevent such a problem that the ends of the leads are leveraged up and outward for example, as viewed in a transversal sectional view. Therefore, the end portions of the lead are appropriately soldered to respective terminals of the substrate splits.

According to a preferred embodiment of the present invention, the first and/or the second substrate splits are joined with still another substrate split via another of the joint member.

The above arrangement enables to manufacture a circuit substrate of a construction in which a large number of the substrate splits are collectively jointed via a plurality of the joint members. Further, each of the joints offers flexible bending via the joint member. As a result, according to this arrangement, even if the circuit substrate is large as a whole, accommodating space within the case can be effectively used by bending the circuit substrate into a desired shape.

A circuit substrate provided by a second aspect of the present invention comprises:

a first substrate split formed with a predetermined wiring pattern and a second substrate split formed with a predetermined wiring pattern joined with each other electrically and/or mechanically by a bendable joint member.

The joint member includes:

a first jointer connecting the substrate splits on their respective upper surfaces, and a second jointer connecting the substrate splits on their respective lower surfaces.

With the above arrangement, the jointers for joining the substrate splits are disposed in such a way that one of the jointers connects respective upper surfaces of the substrate splits, whereas the other jointer connects respective lower surfaces. Therefore, according to this arrangement, a substantially large number of wirings can be provided in the entire joint member, enabling to increase electric current capacity in the joint member as a whole. According to this arrangement, even if a relatively high amperage of power voltage signal is passed in the signal transmission between the substrate splits, there is no need for increasing the size of the joint member itself. Still further, the arrangement allows favorable transmission of electric signals without need for increasing the number of wirings per joint member.

Preferably, the first jointer is longer than the second jointer.

With the above arrangement, if the circuit substrate as a whole is bent for example, the first and the second jointers are bent. With the arrangement that the first jointer is longer than the second jointer, the first jointer can be bent reasonably naturally, enfolding the second jointer from outside.

Preferably, the first jointer has an intermediate portion bent to be spaced from the second jointer by a predetermined distance.

With this arrangement, since the first jointer has its intermediate portion bent, it is possible to provide an effective space inward of the first jointer when the two joint members are bent. Therefore, according to the above arrangement, the distance between the two joint members can be kept more reliably, enabling to prevent the joint members from contacting each other.

Preferably, at least the first jointer includes a plurality of leads disposed in parallel to each other and films sandwiching the leads from above and below.

According to the above arrangement, the joint member has a structure in which each of the leads is held by the films integrally therewith. Therefore, according to this arrangement, like the embodiments described earlier, the joint member can be formed into a shape similar to a common, flat package of semiconductor chip. Thus, the joint member can be reliably bonded to the substrate splits by using an automatic machine such as a suction collet.

Preferably, at least the second jointer includes a plurality of connecting strips disposed in parallel to each other.

With the above arrangement, the second jointer can be given a simpler construction than such a jointer in which a plurality of leads are sandwiched between the films. Thus, it becomes possible to reduce parts cost and manufacturing cost.

Preferably, each of the joint members is dedicated to a specific kind of electric signal. Specifically, one of the joint members carries a power voltage signal and the other of the joint members carries a control signal that differs from the power voltage signal. Here, the term "control signal" refers collectively to signals transmittable through the leads, such as data signal and control signal, other than the power voltage signal.

With the above arrangement, different kinds of electric signals, i.e. the power voltage signal and the control signal are transmitted in dedicated joint members respectively. Therefore, according to this arrangement, the path for the control signal is provided separately from the other joint member that serves as the path for the power voltage signal. As a result, it becomes possible to greatly reduce adverse influence of noise for example, from the power voltage signal to the control signal.

A third aspect of the present invention provides a battery pack.

The battery pack comprises: a circuit substrate comprising a first substrate split formed with a predetermined wiring pattern and a second substrate split formed with a predetermined wiring pattern. The substrate splits are electrically and/or mechanically joined together. The circuit substrate is bendable at the joint, connected with a battery, and incorporated in a case.

The joint is provided by a bendable joint member including a plurality of leads disposed in parallel and held by a thin piece of base film integrally therewith. The joint member is attached to the first and the second substrate splits.

The circuit substrate incorporated in the case is bent to yield to the battery.

With the above arrangement, the circuit substrate incorporated in the case is the one according to the above first aspect. Therefore, according to this arrangement, the above described advantages offered by the first aspect are instantly obtained. Further, the circuit substrate is incorporated as bent to yield to the battery, making possible to dispose the circuit substrate favorably within the case, leading to an advantage of a favorably reduced outer dimension of the battery pack.

A fourth aspect of the present invention provides a method of manufacturing a circuit substrate comprising a first substrate split formed with a predetermined wiring pattern and a second substrate split formed with a predetermined wiring pattern. The substrate splits are electrically and/or mechanically joined together, and the circuit substrate is bendable at the joint. The method comprises:

a step of manufacturing, as a member to attach as the joint, a bendable joint member including a plurality of leads disposed in parallel and held by a thin piece of base film integrally therewith; and a step of attaching the joint member as the joint, by first placing the first and the second substrate splits closely to each other generally on a same plane, and then connecting end portions of each lead to predetermined adjacent places respectively of the substrate splits.

The above method of manufacturing the circuit substrate enables to realize the advantages offered by the circuit substrate according to the first aspect in actual manufacturing steps. As a result, according to the present method of manufacture, a structurally superior circuit substrate can be obtained.

Preferably, the leads are first held by the base film integrally therewith, and then deformed into a gull wing pattern, in the step of manufacturing the joint member.

Further, the ends of each lead are aligned with the respective predetermined places of the substrate splits for the connection, in the step of attaching the joint member.

According to the above method of manufacturing the circuit substrate, the joint member is entirely shaped into a gull wing pattern along the leads. According to the present method, the joint member can be handled by such a machine as a chip mounter. The electrical connection between the first and the second substrate splits are reliably established by the joint member.

Preferably, the step of manufacturing the joint member includes: preparing an electrically conductive frame formed with a pattern of slit group continually in a longitudinal direction, (The slit pattern is formed in a crosswise direction and to serve as the plurality of leads); pasting tapes that are to serve as the base film, perpendicularly to and integrally with the slit groups; and then cutting the conductive frame into pieces each including the slit group, thereby obtaining a plurality of joint members.

According to the above method of manufacture, the conductive frame which is to be the leads is integrated with films in the form of tape which is to be the base film. Then, the joint members can be obtained by continually or simultaneously cutting the integrated component at predetermined places. According to the present method, in such a step of manufacturing a part as the above, a plurality of the joint members can be efficiently and automatically produced.

According to a preferred embodiment of the present invention, the step of manufacturing the joint member includes: sandwiching the leads that are disposed in parallel to each other, from above and below, between films extending perpendicularly to the leads; applying heat thereby allowing a bonding layer of each film to melt to fill spaces between the leads; allowing solidification at a room temperature, thereby forming from the bending layer a retainer for retaining each lead in separation from adjacent ones at a predetermined distance.

According to the above method of manufacture, by sandwiching the leads disposed in parallel to each other, with the films from above and below, and applying heat, the bonding layers of the films are melted to fill space between the leads. Then, by solidifying the bonding layer at a room temperature, the retainer capable of retaining mutually adjacent leads at a predetermined distance can be formed. As described, the retainer that retains the mutually adjacent leads can be formed by a simple method such as applying heat when the tapes are attached to the leads.

According to a preferred embodiment of the present invention, the step of manufacturing the joint member includes: forming a recess having a generally V-shaped section at each end portion of the lead; bending a portion of the lead which is inward of each recess; connecting each bent portion to a terminal in corresponding one of the substrate splits; and thereafter cutting the lead at the recess.

According to the above method of manufacture, the lead is formed with a generally V-shaped recess, then the end portions of the lead are connected to the terminal portions of the respective substrate splits, and finally the lead is cut at the recess. For example, if the joint member is part of a tie bar during the manufacture, the lead is cut off the tie bar finally, when the tie bar becomes unnecessary. Thus, according to the present method of manufacture, since the tie bar is removed after the joint member has been connected to the substrate splits, it becomes possible to reduce inconsistency otherwise results if the cutting of the leads is made before the joint member has been connected to the substrate splits.

Further, a portion of the lead which is inward of each recess is bent, and the bent portion is connected to the terminal of the substrate split. Therefore, end portion of the lead except the cut face (end face) is connected to the terminal portion, allowing solder fillet to form appropriately, enabling to bond the lead firmly to the terminal portion of the substrate split.

A fifth aspect of the present invention provides a method of manufacturing a circuit substrate. The method comprises: a step of making substrate splits; a step of making a bendable joint member electrically and/or mechanically joining the substrate splits together; and a step of joining the substrate splits with the joint member.

A first jointer is made in the step of making the joint member, by first sandwiching leads disposed in parallel to each other, from above and below, with films extending perpendicularly to the leads, and then bending the leads at their intermediate portion.

A second jointer is provided by a plurality of connecting strips disposed in parallel to each other.

In the step of joining the substrate splits with the joint member, the substrate splits are joined together by the first jointer connecting respective upper surfaces of the substrate splits.

Further, the substrate splits are joined together by the second jointer connecting respective lower surfaces of the substrate splits.

Other features and advantages of the present invention will become clearer from the following description of embodiments to be presented with reference to the accompanying drawings.

BEST MODE FOR CARRYING OUT THE INVENTION

Hereinafter, preferred embodiments of the present invention will be described with reference to the attached drawings. Note that throughout these figures, the identical or similar members are indicated by the same reference codes respectively.

Figure 29:
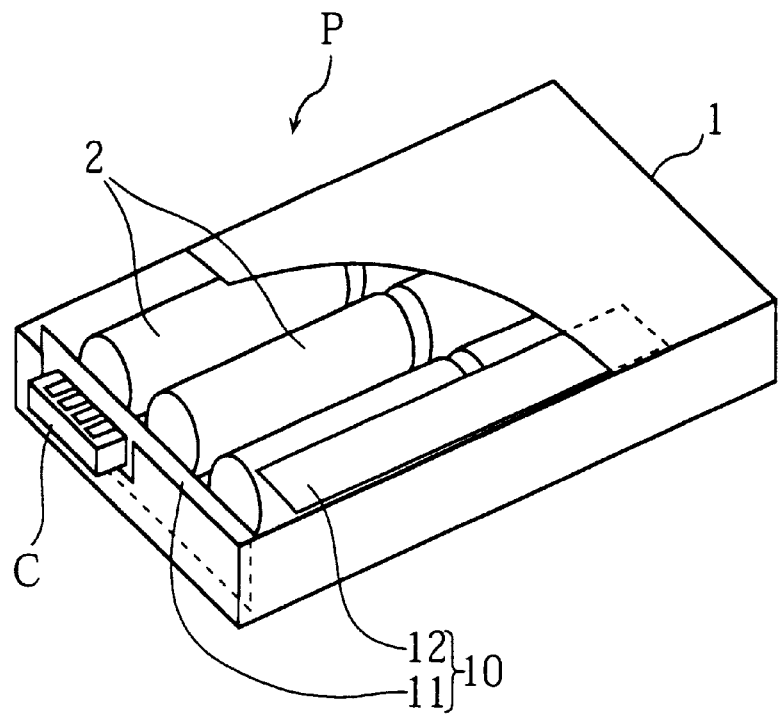
FIG. 29 is a perspective view with a partial section, of a battery pack to which a conventional circuit substrate is applied.
Figure 30:
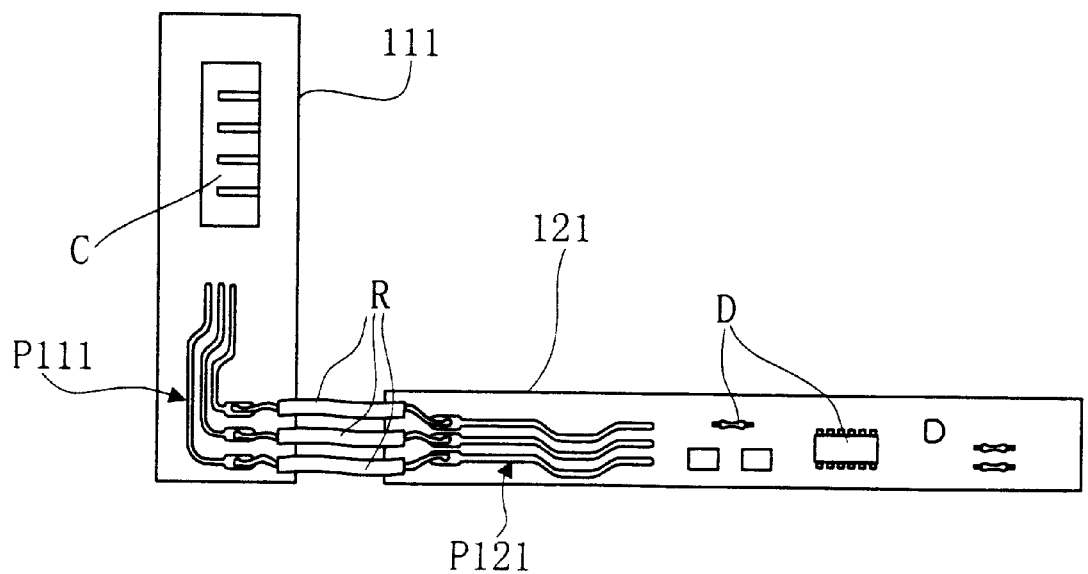
FIG. 30 is a plan view of a conventional circuit substrate.
Figure 31:
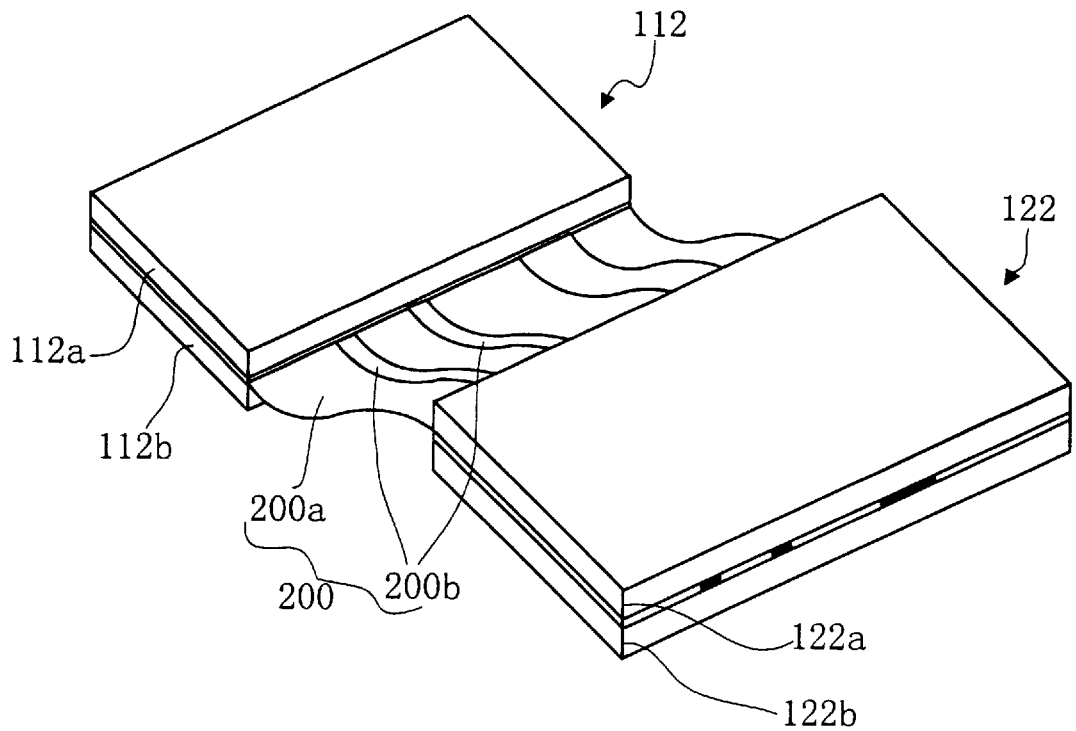
FIG. 31 is a perspective view of a conventional circuit substrate.
Figure 32:
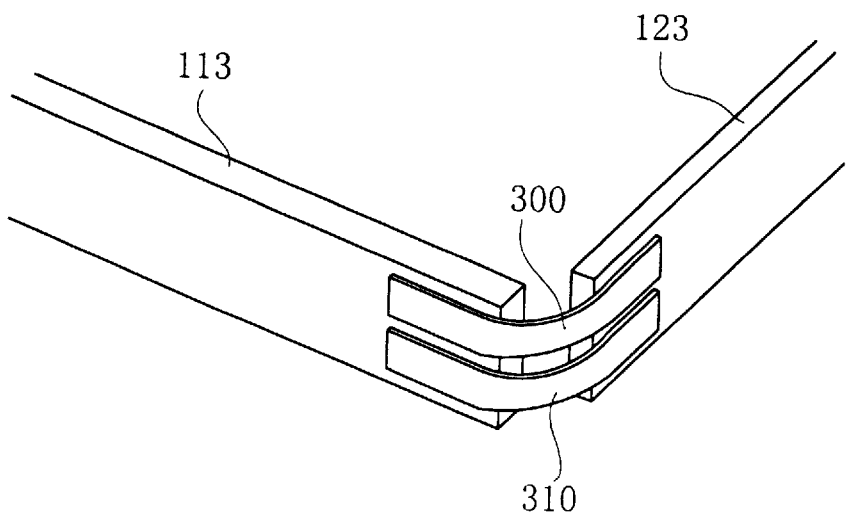
FIG. 32 is a perspective view showing s principal portion of a conventional circuit substrate.

As shown in FIG. 29, a circuit substrate according to an embodiment of the present invention is incorporated in a case 1 of a battery pack P of e.g. a laptop computer. As shown in FIG. 1 through FIG. 4, the circuit substrate 10 mainly comprises a first substrate split 11, a second substrate split 12 and a joint member 13.

The circuit substrate 10 must be disposed in the case 1, within a limited space not occupied by batteries 2. For this reason, the circuit substrate 10 has its first and the second substrate splits 11, 12 joined with each other as well as electrically connected with each other via the joint member 13. The circuit substrate 10 is flexibly bendable at its joint portion JP.

It should be noted here that throughout the drawings, certain components may be illustrated in slightly different proportions and/or shapes. This is to depict characteristic portions more clearly, and does not mean any alternation of the characteristics essentially.

Figure 1:
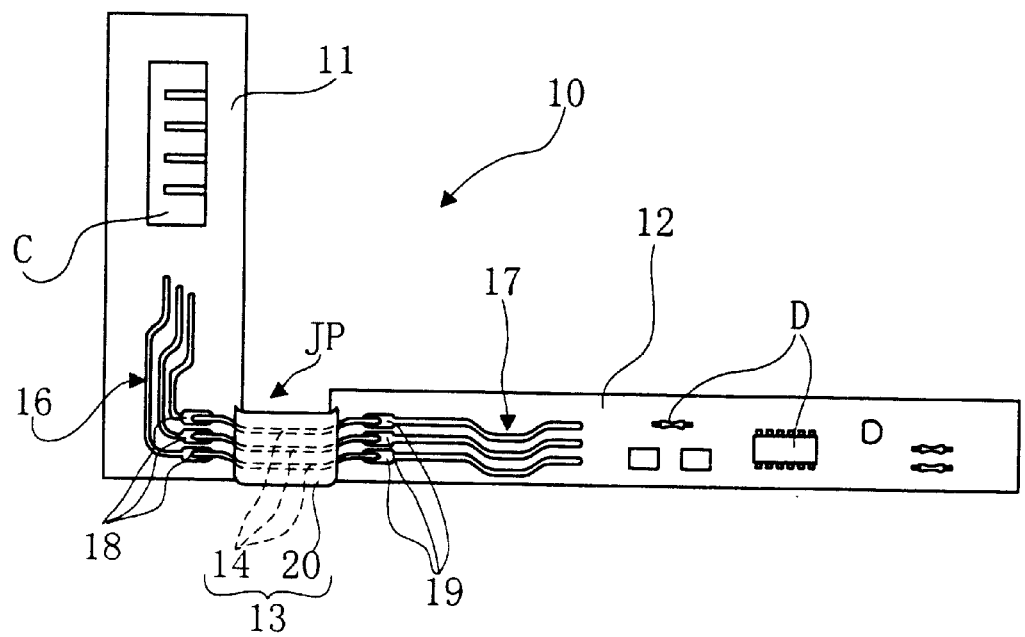
FIG. 1 is a simplified plan view of a circuit substrate according to a first embodiment of the present invention.

As shown if FIG. 1, each of the first and the second substrate splits 11, 12 is a rigid printed substrate having one or two surfaces respectively formed with predetermined wiring patterns 16, 17. Each of the splits 11, 12 is rectangular to favorably fit into a predetermined space while avoiding the batteries 2 in the case 1.

Surfaces of the substrate splits 11, 12 are mounted with e.g. a connecter C and electronic parts D such as a semiconductor chip and a resister. The electronic parts D are electrically connected to appropriate one of the wiring patterns 16, 17. Further, in each of the surfaces of the substrate splits 11, 12, terminals 18, 19 respectively of the wiring patterns 16, 17 are formed near the joint portion JP. The terminals 18, 19 are connected with respective leads 14 of the joint member 13. The substrate splits 11, 12 thus joined with each other via the joint member 13 operate electrically integrally as one circuit substrate. Battery power supply or electrical signal exchange between the battery 2 and external components is performed via the connector C and the electronic parts D.

As shown in FIG. 1 through FIG. 4, the joint member 13 is flexibly bendable, comprising a plurality of leads 14 disposed in parallel, and a thin piece of base film 20 holding the leads integrally therewith. As shown in FIG. 1 through FIG. 4, the joint member 13 interconnects the first and the second substrate splits 11, 12 at the joint portion JP, thereby electrically connecting the two splits to each other.

Figure 3:
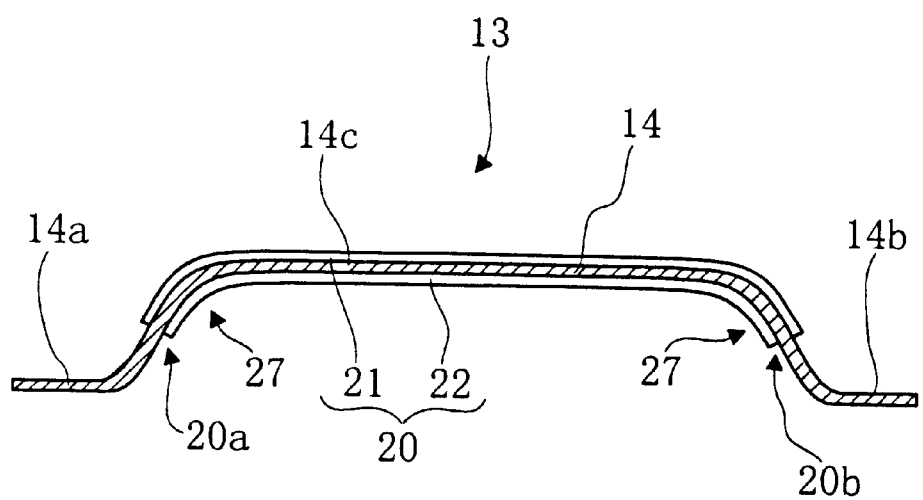
FIG. 3 is a sectional view taken in lines X—X in FIG. 2.
Figure 4:
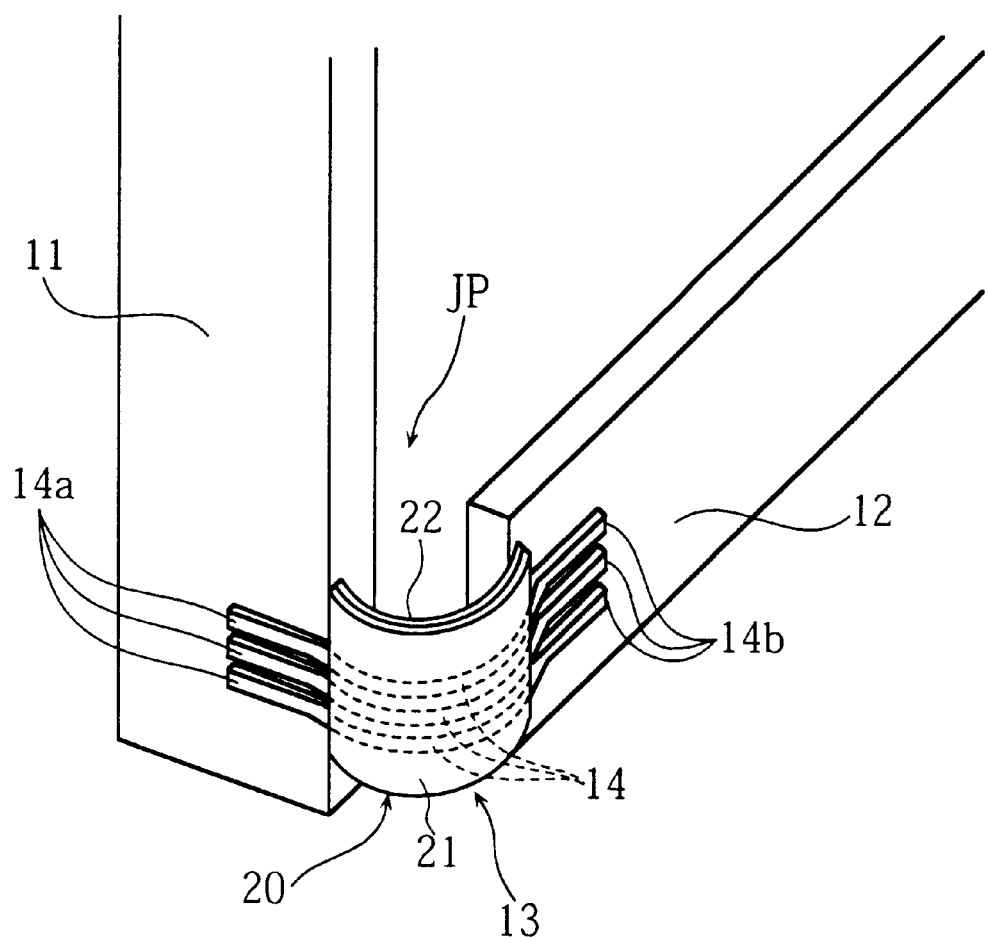
FIG. 4 is a perspective view showing a principal portion of the circuit substrate in FIG. 1 in a bent state.
Figure 5:
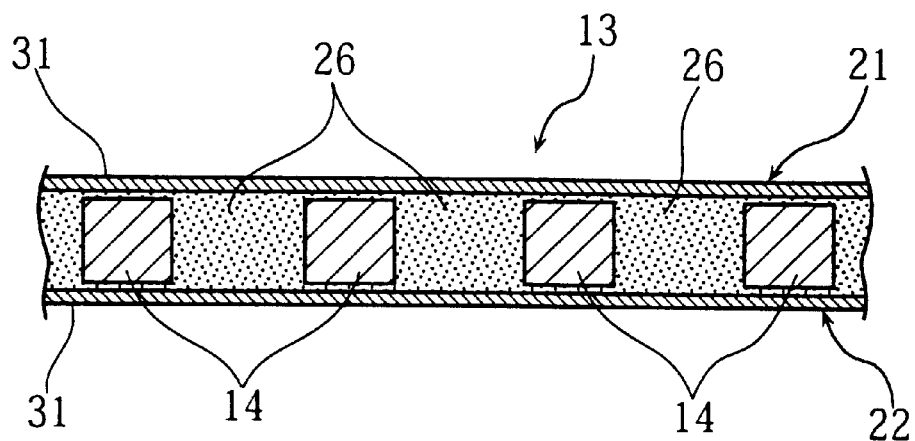
FIG. 5 is a sectional view taken in lines Y—Y in FIG. 2.

As shown in FIG. 3, the base film 20 of the joint member 13 is made of two thin pieces of films 21, 22 made of e.g. a polyimide resin, which are pasted together to sandwich the leads 14. The base film 20 provides the leads 14 with electric insulation, and is heat resistant. As shown in FIG. 5, a retainer 26 is formed in order to retain mutually adjacent leads 14 at a predetermined distance from each other. The retainer 26 is formed by melting and then solidifying bonding layers of the films 21, 22 as will be described later.

Figure 2:
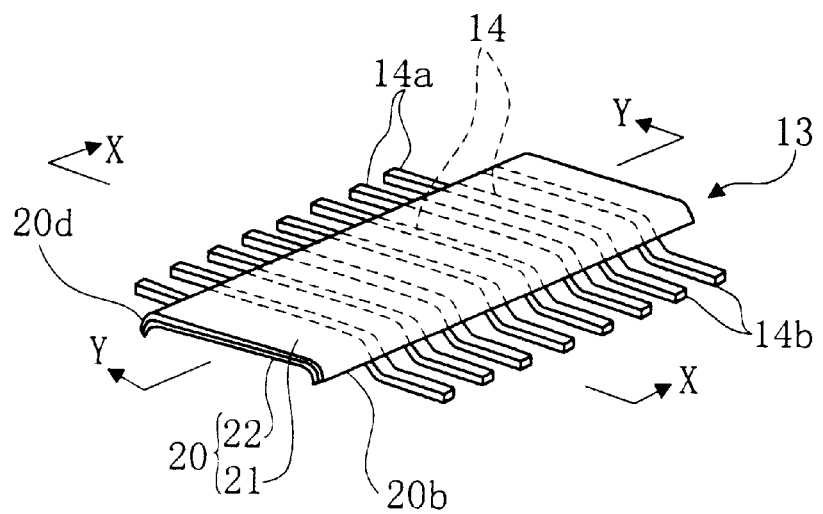
FIG. 2 is a simplified perspective view of a joint member shown in FIG. 1.

The leads 14 include a plurality of electrical wires made of e.g. nickel or copper laid in parallel to each other at a predetermined interval. Specifically, each of the leads 14 has a width of 0.2 approx. and the distance between the mutually adjacent leads 14 is 0.3 mm approx. The leads 14 are deformed by a method to be described later, and as a result, the joint member 13 as a whole has a unique shape like a gull wing as shown in FIG. 2 and FIG. 3.

Each of the leads 14 has its ends 14a, 14b left exposed when the leads 14 are sandwiched by the films 21, 22. The end portions 14a, 14b of each lead 14 extend downwardly out of respective side edges 20a, 20b of the base film 20 and then bent horizontally. This provides a height difference 27 between the end portions 14a, 14ba and an intermediate portion 14c of the lead 14. The difference in the height is only slightly greater than the thickness of the film 22. The end portions 14a, 14b of each lead 14 are bonded to the respective terminals 18, 19 (See FIG. 1) of the substrate splits 11, 12. As will be understood, the overall shape of the joint member 13 is made like a gull wing in order to provide favorable footing of the lead 14 with respect to the terminals 18, 19.

Figure 6:
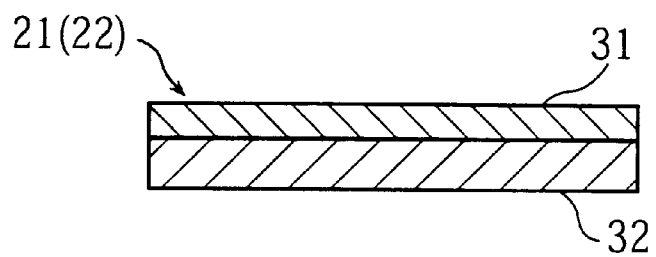
FIG. 6 is a sectional view of a film.

Each of the films 21, 22 of the base film 20 includes as shown in FIG. 6, a tape layer 31 and an bonding layer 32 at an early stage of the manufacture. The tape layer 31 is made of e.g. a polyimide resin. The bonding layer 32 is formed on a lower surface of the tape layer 31, and serves as an adhesive. Specifically, the bonding layer 32 is melted and then solidified when sandwiching the leads 14, to provide the retaining member 26.

The bonding layer 32 is provided by a thermosetting silicone adhesive (e.g. silicone rubber). Alternatively, an epoxy adhesive, or others may be used. The tape layer 31 is given a thickness of 25 µm in general, whereas the bonding layer 32 is given a thickness not smaller than 25 µm. With the above arrangement, as will be described later, the bonding layer 32 is thermally half-melted to fill space between the leads 14. The thickness of the bonding layer is predetermined so that the adhesive that forms the bonding layer 32 has an appropriate volume to sufficiently fill the space between the leads 14.

When the films 21, 22 are bonded together from above and below, with each of the leads 14 in between, the respective bonding layers 32 adhere to the upper surface and the lower surface of each lead 14. Under this state, when heat is applied, the bonding layers 32 are half-melted to flow and fill the space between the leads 14, and then set. Then, the bonding layer 32 is allowed to solidify at a room temperature to integrate with the leads 14. As a result, as shown in FIG. 5, the bonding layers 32 are transformed into a retainer 26 that retains each lead 14 at a predetermined interval.

The retainer 26 firmly retains each lead 14 within the base film 20 and at the predetermined interval, even if the joint member 13 is subjected to an external force from a lateral direction. Therefore, each lead 14 is protected from contact with an adjacent one of the leads 14 when the base film 20 is deflected for example. The retainer 26 prevents short circuit between adjacent leads 14. Thus, the joint member 13 that provides a joint within the circuit substrate 10 allows favorable operation of the circuit substrate 10. Therefore, a highly reliable joint member 13 can be provided.

Further, according to the retainer 26, for example, even if the interval between the leads 14 is very small, the bonding layer 32 melts to sufficiently fill the space between the leads 14. Therefore, formation of air gaps between the leads 14 is avoided unlike in a case in which two films are simply pasted to each other. It should be noted that the bonding layer 32 serves not only as an adhesive by definition but also as the retainer 26.

The retainer 26, which is a solidified matter of the bonding layer 32 provided by e.g. a silicone adhesive, offers a certain level of elasticity even after the solidification. Therefore, when the joint member 13 which has been connected to the substrate splits 11, 12, is incorporated into the battery pack P, the joint member 13 can be bent easily. Therefore, according to the joint member 13, it becomes possible to firmly hold and flexibility retain each of the lead 14, which enables to reinforce the joint member 13 as a whole.

Next, a method of manufacturing the circuit substrate according to the embodiment 1 of the present invention will be described with reference to FIG. 7 through FIG. 11. In order to finally provide the joint structure of the circuit substrate, the first and the second substrate splits 11, 12 and the joint member 13 are manufactured. Each of the first and the second substrate splits 11, 12 is provided by a common rigid-type, single-surface or double-surface printed substrates. The joint member 13 is manufactured through the steps to be described here below.

Figure 7:
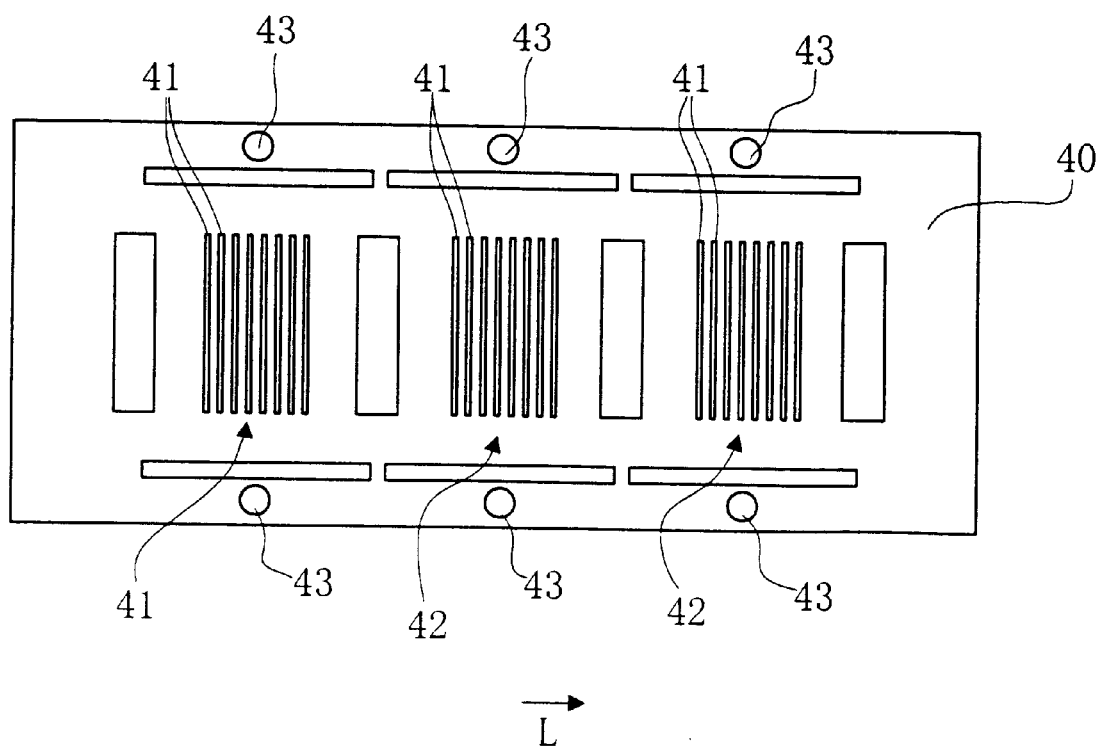
FIG. 7 is a plan view showing a manufacturing step of the joint member.

Specifically, when manufacturing the joint member 13, first, as shown in FIG. 7, an electrically conductive, long frame 40 is punched out along a longitudinal direction L. This leaves the conductive frame 40 with a plurality of slit groups 42 formed at an interval, each including a plurality of slits 41 running perpendicular to the conductive frame. The conductive frame 40 is suitably provided by a plate of e.g. nickel plated with tin for improved affinity with solder. The conductive frame 40 has two longitudinal side margins each formed with feeding holes 43. The conductive frame 40 is continuously transported in the longitudinal direction L via these feeding holes 43 while undergoing each of the manufacturing steps.

A portion of the conductive frame 40 between a pair of mutually adjacent slits 41 will eventually serve as the lead 14. Under a state shown in FIG. 7, the formed slits 41 are slightly longer than the leads 14 to be obtained finally.

Figure 8:
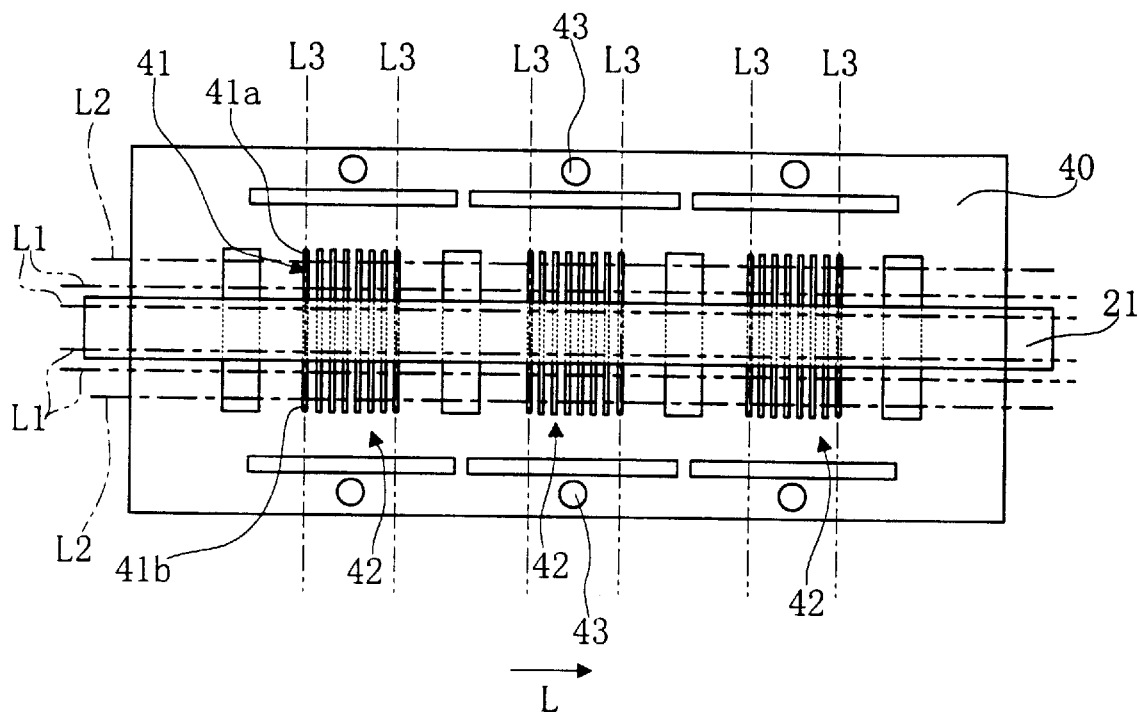
FIG. 8 is a plan view showing a manufacturing step of the joint member.
Figure 9:
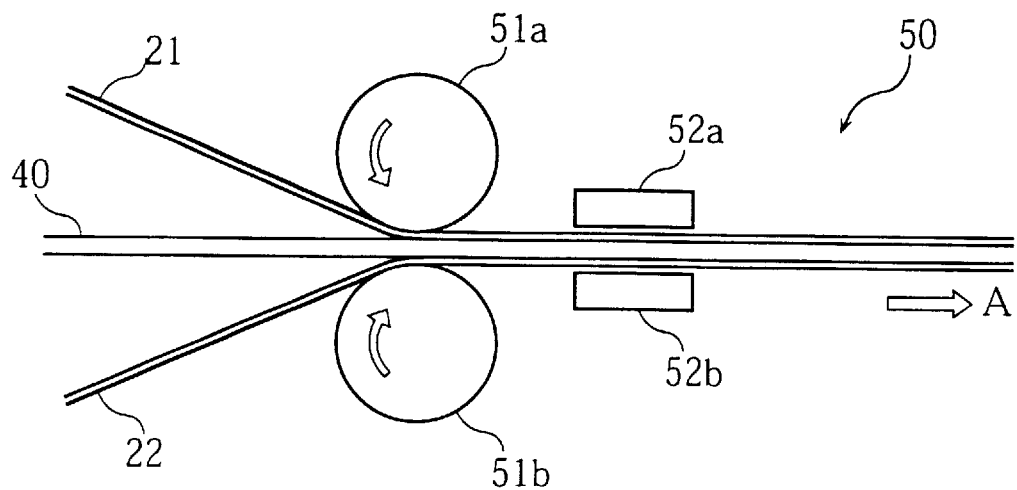
FIG. 9 is an illustration showing a manufacturing step of the joint member.

Next, as shown in FIG. 8 and FIG. 9, films 21, 22 each in the form of a continuous tape is attached respectively to the upper surface and the lower surface of the conductive frame 40 longitudinally of the conductive frame 40. These tapes of films 21, 22 will serve as the base film 20 of the joint member 13. Each of the films 21, 22 has a width slightly shorter than that of the slits 41. Therefore, the ends 41a, 41b of the slits 41 extend out of side edges of the continuous tapes of sandwiching films 21, 22. Note that FIG. 8 shows a state in which the two tapes of films 21, 22 are pasted to each other.

When the base film 20 is pasted to the conductive frame 40, a pasting machine 50 such as shown in FIG. 9 is used. The pasting machine 50 mainly comprises a pair of pivotally disposed upper and lower rollers 51a, 51b, a pair of upper and lower heater blocks 52a, 52b disposed downstream of and closely to the rollers 51, 51b, and an unillustrated transporting device for transporting the conductive frame 40 and the films 21, 22.

The bonding machine 50 transports the conductive frame 40 from the upstream side to the downstream side of the rollers 51a, 51b (See white arrow A in FIG. 9). The rollers 51a, 51b sandwich the conductive frame 40 and paste the films 21, 22 respectively from above and below.

After the rollers 51a, 51b have attached the base film 20, the heater blocks 52a, 52b heat the conductive frame 40 to 150° C. through 200° C., during which the bonding layer 32 in each of the films 21, 22 is half melted to fill space between the leads 14, and then set by the heat from the heater blocks 52a, 52b. The bonding layer 32 thus set is then allowed to solidify at a room temperature, whereby the retainer 26 is formed (See FIG. 5). The retainer 26 retains each of the leads 14 at a predetermined interval from adjacent ones of the leads 14.

A note should be made here that if the bonding layer 32 is provided by a thermosetting material and is solid or can be liquefied at a room temperature, as has been described, the bonding layers 32 is heated by the heater blocks 52a, 52b to become molten first, and then the bonding layer 32 is thermally set by the heat provided by the heater blocks 52a, 52b. However, if the bonding layer 32 is provided by a thermosetting material and is deformable at a room temperature, the bonding layers 32 is heated by the heater blocks 52a, 52b to set immediately. On the other hand, if the bonding layer 32 is provided by a thermoplastic resin adhesive, the bonding layers 32 is heated to soften when the base film 20 is attached to the conductive frame 40, i.e. when the conductive frame 40 is pressed. Thereafter, cooling at a room temperature allows the resin to set. For such an arrangement, the rollers 51a, 51b shown in FIG. 9 may each incorporate a heater, so that the heating is provided when the conductive frame 40 is pressed by these rollers 51a, 51b. With this arrangement, the heater blocks 52a, 52b may be eliminated.

As described, by the use of the bonding layer 32 formed on each of the films 21, 22 and serving as adhesive, the retainer 26 for retaining each lead 14 at a predetermined interval from the adjacent one can be manufactured as easily as has been described. It should be noted here that material for the bonding layer 32 of the films 21, 22 is not limited to a silicone adhesive and an epoxy adhesive, but can be anything as long as it can be thermally half-melted and solidified at a room temperature.

Figure 10:
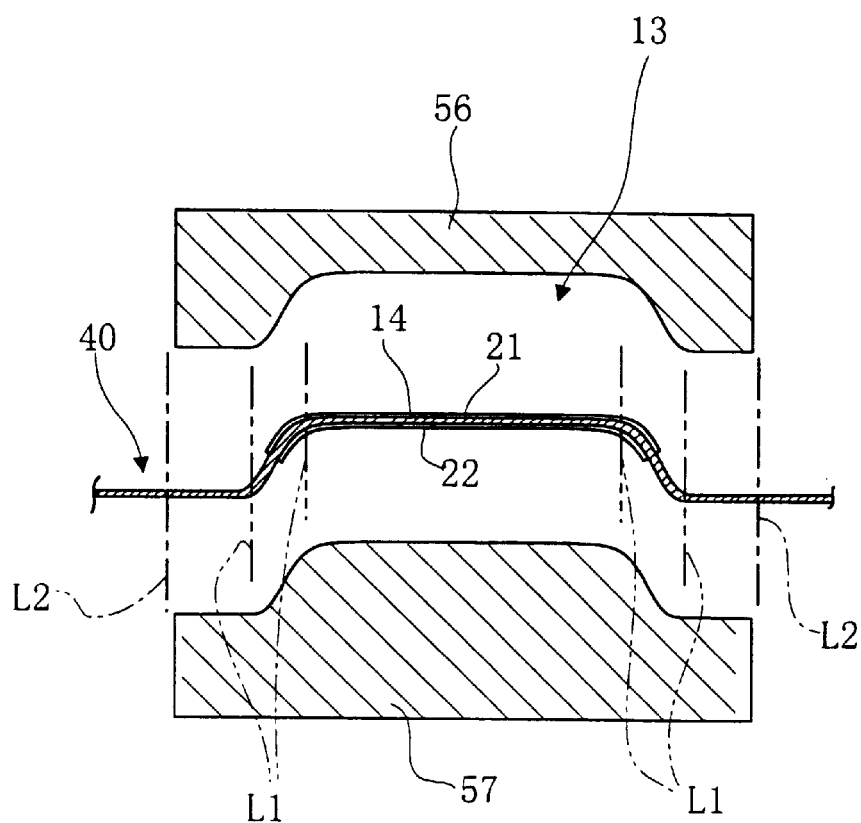
FIG. 10 is a sectional view showing a manufacturing step of the joint member.

Next, as shown in FIG. 8 and FIG. 10, the conductive frame 40 undergoes a pressing and cutting process by means of metal molds 56, 57 and so on, and is bent in press lines L1 indicated by two-dot-and-one-dash lines in the figures.

Then, the conductive frame 40 is cut in cutting lines L2 indicated by one-dot-and-one-dash lines in FIG. 8, at each of the end portions 41a, 41b of the slits 41, whereby a tie bar which is no longer necessary is removed. Next, in accordance with a predetermined final dimension of the joint member 13, cutting is made perpendicularly to the longitudinal direction of the conductive frame 40. Specifically, the conductive frame 40 is cut in one-dot-and-one-dash lines L3 in FIG. 8, which yields individual pieces each represents the joint member 13. In other words, each of the slit groups 42 yields the plurality of leads 14 held between the base films 21, 22. Each of the individual pieces thus obtained is treated as the joint member 13.

Figure 11:
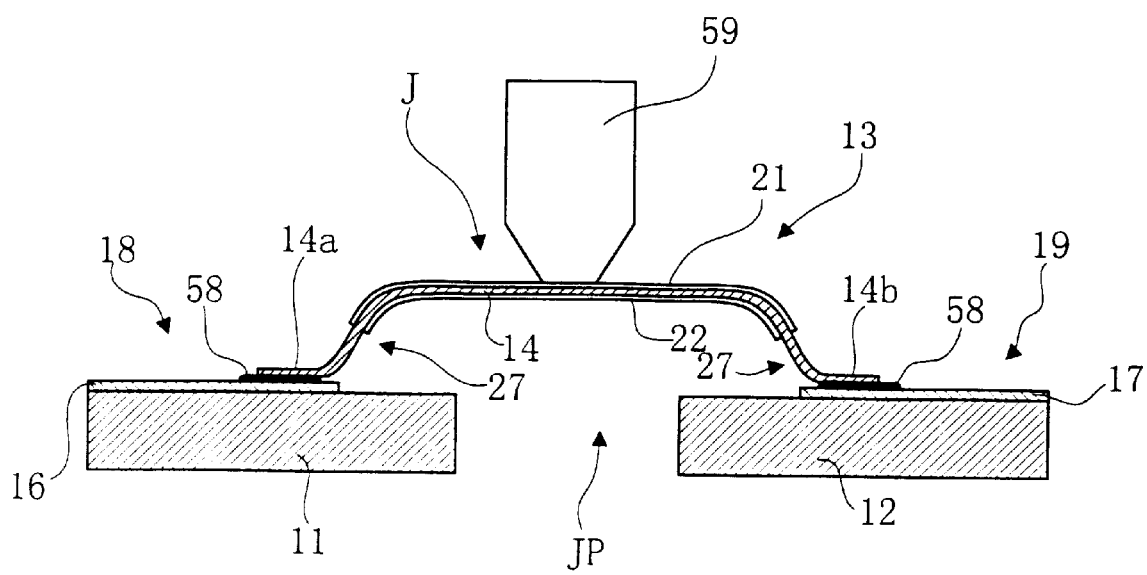
FIG. 11 is a sectional view showing a manufacturing step of the joint member.

The joint member 13 thus manufactured, is transferred and pasted onto an unillustrated paper tape for example. Then, the first and the second substrate splits 11, 12 are joined together via the joint member 13. At this time, as shown in FIG. 11, the first and the second substrate splits 11, 12 are placed close to each other generally on a same plane. The terminals 18, 19 of the respective wiring patterns 16, 17 in the first and the second substrate splits 11, 12 are each coated with solder 58 in advance. The joint member 13 is sucked by a vacuum suction collet 59 and the end portions 14a, 14b of the leads 14 are aligned with the terminals 18, 19 respectively.

In the above, the joint member 13 as a whole has a gull wing shape, with the slight height difference 27, and therefore is reliably footed and bonded to respective end portions 18, 19 of the wiring patterns 16, 17. The joint member 13 is prone to thermal deformation during e.g. a solder re-flow process. However, according to the joint member 13, the gull wing shape including the bent portions makes the base film 20 less prone to coming off the leads 14.

Further, the joint member 13 contacts with the terminals 18, 19 via the solder 58 only at the end portions 14a, 14b of the leads 14. Therefore, electric continuity provided by the leads 14 can be maintained reliably. It should be noted here that the devices such as the vacuum suction collet 59 used in the step of joining with the joint member 13 are the same type of devices as used on a chip mounter which is popularly employed in a step of mounting semiconductors for example. Also, the joint member 13 is attached through a similar mounting step as for the semiconductor chip for example.

With the steps described above, the first and the second substrate splits 11, 12 are electrically connected to each other via the joint member 13 as well as mechanically joined to each other. Specifically, the circuit substrate 10 easily bendable at the joint portion JP is provided finally. Needless to say, operations at each of the steps described above, until the circuit substrate as the final product can be obtained, are performed automatically.

The circuit substrate 10 comprising the first and the second substrate splits 11, 12 and the joint member 13 joining them is incorporated in e.g. the battery pack P such as shown in FIG. 29. In this case, the joint member 13 is incorporated as bent. The leads 14 of the joint member 13 are firmly retained by the base film 20. Therefore, the leads 14 are reliably protected from coming off the terminals 18, 19 (See FIG. 11), and from causing poor electrical contact.

The first and the second substrate splits 11, 12 can be provided by a simple rigid type printed circuit board having one or both surfaces formed with the wiring patterns 16, 17 respectively. On the other hand, the joint member 13 can be manufactured separately from the first and the second substrate splits 11, 12 and then attached at the joint portion JP. Therefore, according to the above arrangement, each of the manufacturing steps can be simplified. The present arrangement enables to reduce the number of parts and materials necessary for the circuit substrate 10 as a whole, and to reduce product cost of the circuit substrate 10 itself.

Further, the joint member 13 is given a certain level of stiffness by the leads 14 so it is elastically deformable. On the other hand, the joint member 13 is given flexible bendability by the base film 20 which also provides electric insulation, heat resistance and so on. Therefore, according to the present arrangement, it is possible to efficiently assemble the circuit substrate into e.g. the case 1 while bending the joint member 13.

Figure 12:
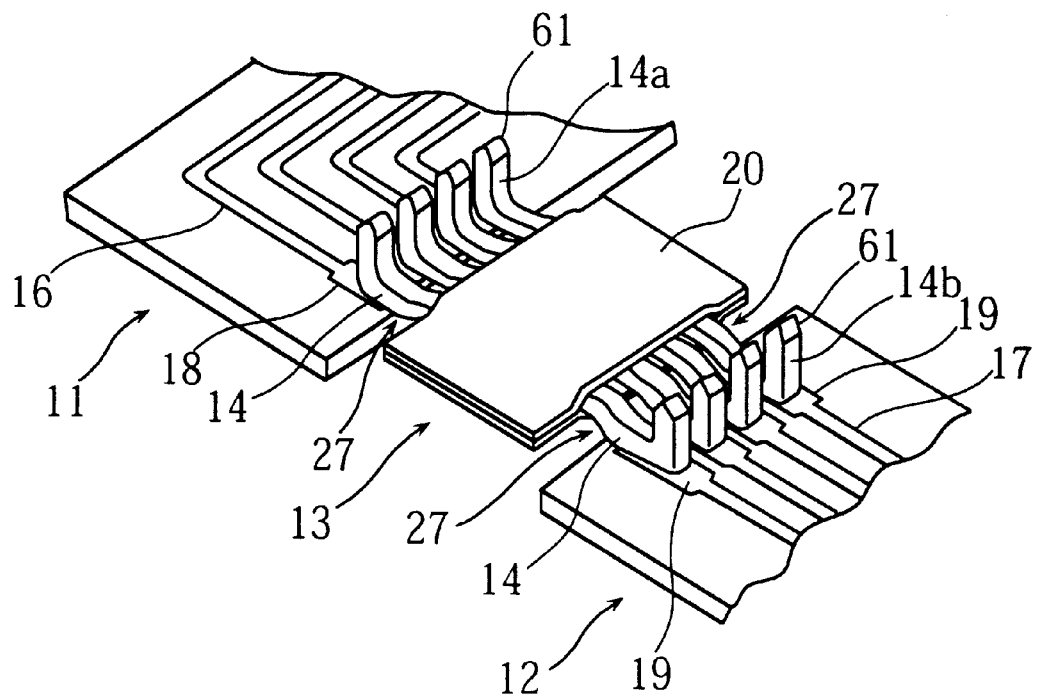
FIG. 12 is a perspective view showing a principal portion of a circuit substrate according to a second embodiment of the present invention.

Next, reference will be made to FIG. 12 and FIG. 13. These figures show a circuit substrate according to a second embodiment of the present invention. According to the circuit substrate 10 offered by the present embodiment, end portions 14a, 14b of each lead 14 are bent upward, or generally perpendicularly, so that each end surface 61 faces upward. Due to this arrangement, when each lead 14 is bonded to the terminals 18, 19 of the substrate splits 11, 12, the leads 14 are fixed by the solder at their respective end portions 14a, 14b excluding however the end faces 16.

In manufacturing the joint member 13, generally, the leads 14 have their surfaces plated with tin for example, in advance. Then, when the leads 14 are cut in order to remove unnecessary tie bar, the end faces 61, which are not plated with tin, are exposed. By using the tin-plated end portions 14a, 14b but not the end faces 16 when soldering the leads 14 to the terminals 18, 19, formation of solder fillet 62 is facilitated.

Figure 13:
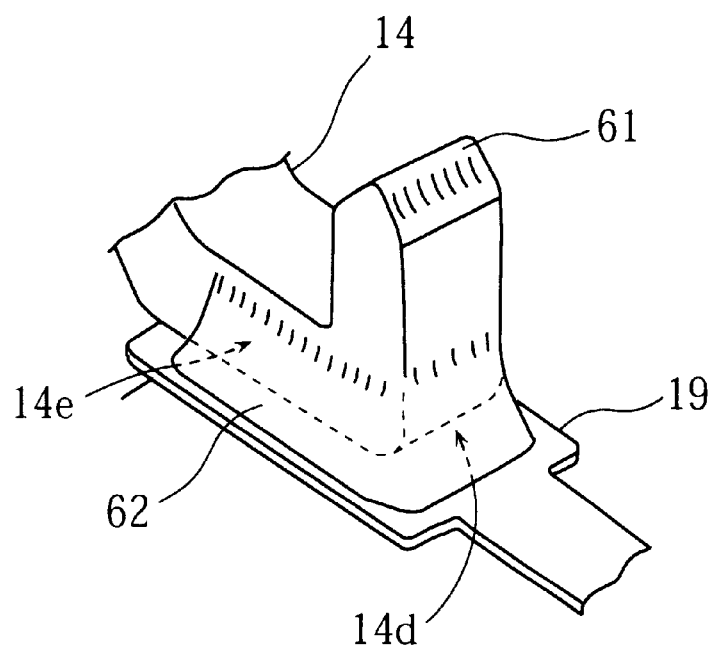
FIG. 13 is a perspective view showing a principal portion of a lead shown in FIG. 12.

According to the present embodiment, as shown in FIG. 13, each lead 14 is bent so each cut section (the end face) 61 of the lead 14 is faced upward. The leads 14 is bonded to a corresponding one of the terminals 18, 19 of the first and the second substrate splits 11, 12 at its bent portion 14d and/or at a portion inward of the bent portion 14d. Therefore, the end face 61 for example of the lead 14 is not fixed by the solder, and the solder fillet 62 is formed on the tin-plated surfaces, i.e. side surfaces 14e of the lead 14. Thus, the lead 14 can be bonded more firmly to the terminals 18, 19, without causing flaw in the bonding provided by the solder fillet 62, enabling to increase the bonding by the solder.

Figure 14:
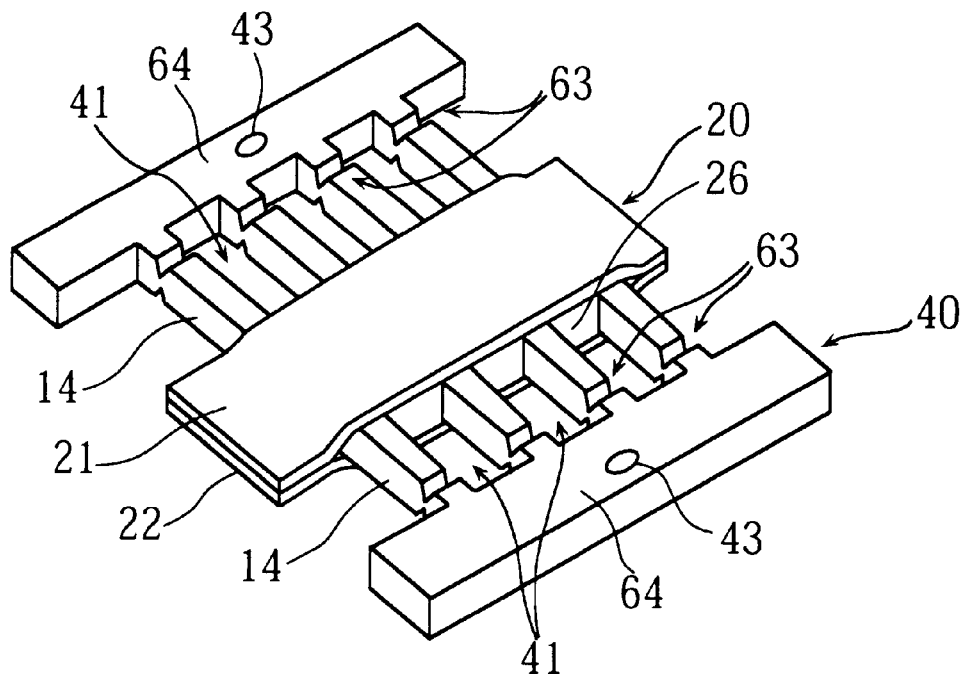
FIG. 14 is a perspective view showing a manufacturing step of the joint member shown in FIG. 12.
Figure 15:
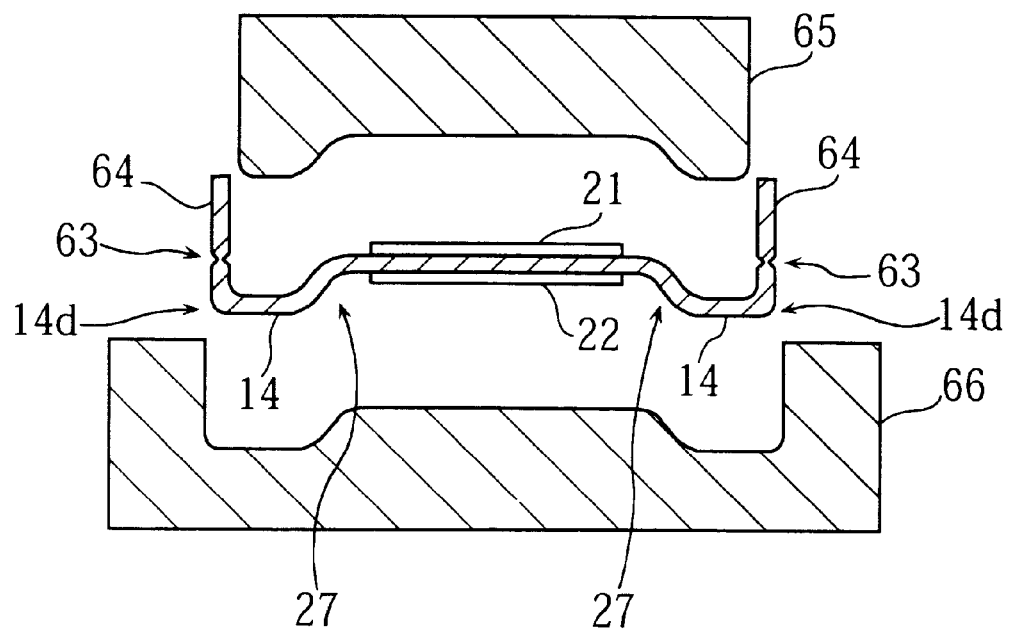
FIG. 15 is a sectional view showing a manufacturing step of the joint member shown in FIG. 12.

FIG. 14 and FIG. 15 show manufacturing steps of the circuit substrate offered by the second embodiment. The method of manufacturing the circuit substrate according to the second embodiment is generally the same as of the circuit substrate according to the first embodiment. The description hereafter will primarily cover differences between the two.

According to the present method of manufacture, again, the conductive frame 40 formed with a plurality of slit groups 42 is partially sandwiched by the films 21, 22, and then the conductive frame 40 is cut in the direction perpendicular to its longitudinal direction. This operation yields, as shown in FIG. 14, a piece to serve as the joint member 13. Next, along the longitudinal direction of the conductive frame 40, a recess 63 having a generally V shaped section is formed on each lead 14 on each side of the base film 20 at a laterally outward position. The recess 63 is also formed correspondingly on the lower surface of the lead 14. These recesses 63 facilitates cutting of the conductive frame 40 when a tie bar 64 becomes unnecessary and is removed later.

The recess 63 may be formed before the conductive frame 40 is cut in the direction perpendicular to its longitudinal direction, into an individual piece to serve as the joint member 13. Namely, the recess formation may be performed while the conductive frame 40 is still in the continuous ribbon-like state.

Thereafter, the lead 14 is bent at an intermediate portion of the conductive frame 40. More specifically, the bending is made at a portion inward of each recess 63 and outward of the base film 20, using a pair of metal molds 65, 66 as shown in FIG. 15 to obtain a gull wing shape. Simultaneously, the portion 14d which is outward of the step 27 and inward of the recess 63 of the lead 14 is bent generally perpendicularly so that the tip of the lead 14 points upward.

Next, the end portions 14a, 14b of the lead 14 are bonded respectively to the terminals 18, 19 of the first and the second substrate splits 11, 12. Since each of the end portions 14a, 14b of the lead 14 is bent, the solder fillet 62 can be formed sufficiently between the side surfaces 14e of the lead 14 and the respective terminals 18, 19 as shown in FIG. 13. Therefore, the leads 14 can be reliably bonded to the respective terminals 18, 19 of the first and the second substrate splits 11, 12.

Next, the lead 14 is cut at the recesses 63, to remove the unnecessary tie bar 63. Since the lead 14 is formed with the recesses 63 in advance, the cutting can be achieved by a smaller force than in a case in which there is no recess 63 formed. Therefore, the lead 14 can be cut easily, enabling to improve operability.

Further, since the tie bar 64 is removed after the joint member 13 is bonded to the terminals 18, 19 of the first and the second substrate splits 11, 12, it is possible to reduce inconsistency in the pitch of the leads 14 caused by dimensional error of the pressing machine.

Figure 16:
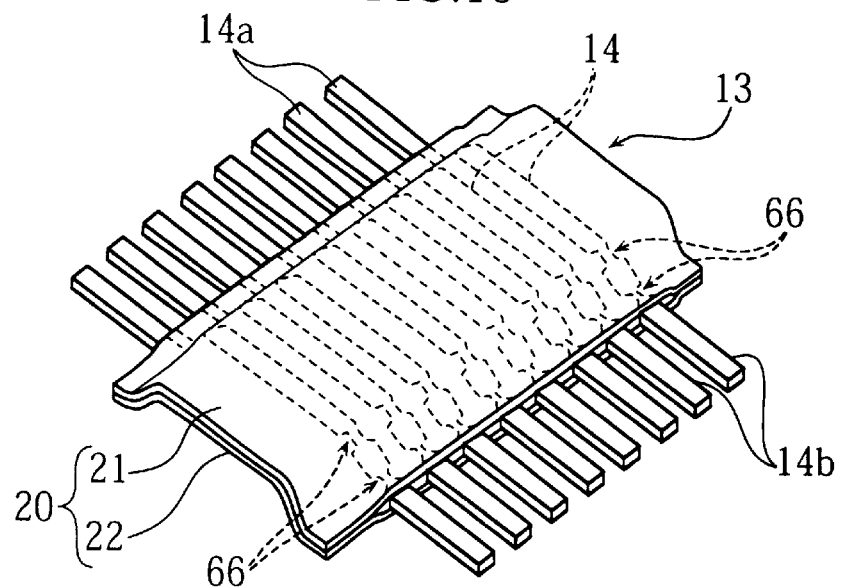
FIG. 16 is a perspective view of a circuit substrate according to a third embodiment of the present invention.
Figure 17:
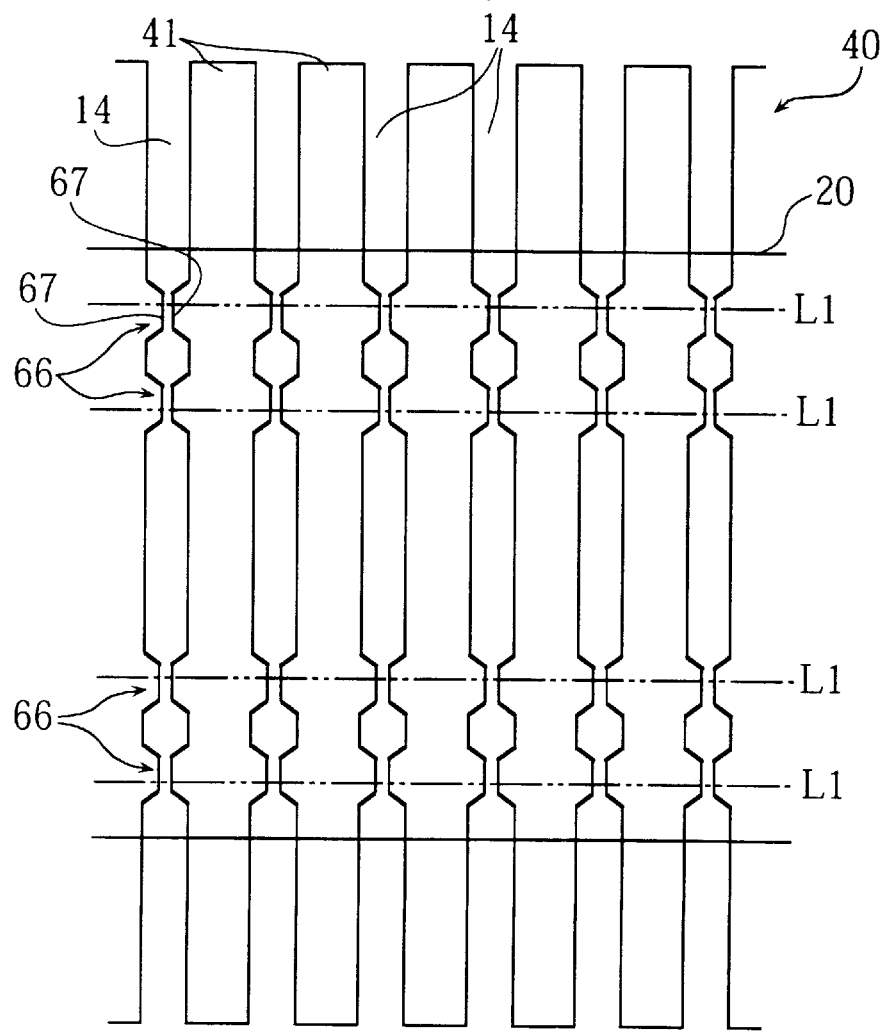
FIG. 17 is a plan view of a principal portion, showing a manufacturing step of a joint member shown in FIG. 16.

FIG. 16 is an illustration of a joint member of a circuit substrate according to a third embodiment of the present invention. FIG. 17 is an enlarged view showing a principal portion of an electrically conductive frame 40 used in manufacture of the joint member. According to the present embodiment, the conductive frame 40 is bent along two-dot-and-one-dash lines L1 so that the entire joint member 13 is shaped into a gull wing pattern. Each of the leads 14 is formed in advance with narrow portions 66 each having a width smaller than a width of the other portion of the lead 14, at each bending portion. The narrow portion 66 is defined by a recess 67 formed on each side of the lead 14 at the bending portion. The narrow portion 66 is formed simultaneously with the slits 41 when the conductive frame 40 is punched out.

As described above, formation of the narrow portion 66 in the lead 14 reduces stress when bending the lead 14 by pressing, and therefore the lead 14 can bend easily. Thus, it becomes possible to reduce such a problem as caused during the solder re-flow operation that the angle of bending is increased due to softening of the base film 20, making the ends 14a, 14b of the lead 14 leveraged up as viewed in a sectional view. The end portions 14a, 14b of the lead 14 are appropriately soldered to respective terminals 18, 19 of the first and the second substrate splits 11, 12. Therefore, it is possible to prevent lose contact at the end portion 14a, 14b of the lead 14. Further, since the narrow portion 66 is formed only at each bending portion of the lead 14, the lead 14 has an area of contact with the films 21, 22 generally the same as in a case in which there is no narrow portions 66 formed. Therefore, there is no adverse effect to the quality of bonding between the lead 14 and the films 21, 22.

Figure 18:
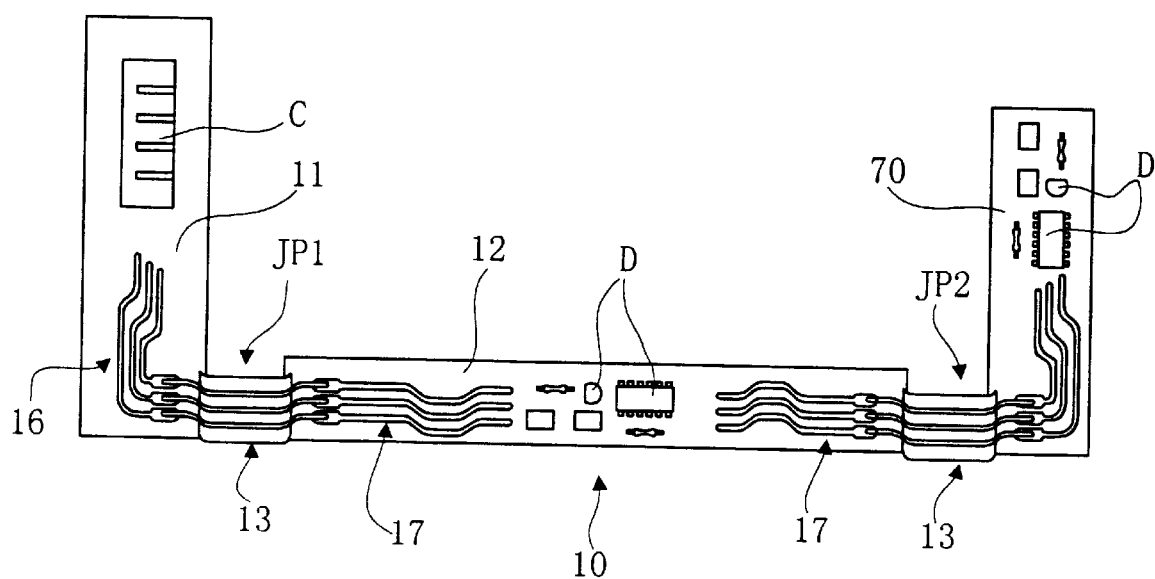
FIG. 18 is a simplified plan view of a circuit substrate according to a fourth embodiment of the present invention.

FIG. 18 is a simplified plan view of a circuit substrate according to a fourth embodiment of the present invention. The circuit substrate shown in this figure comprises the first and the second substrate splits 11, 12 shown in FIG. 1 and further, a third substrate split 70 joined via another of the joint member 13. The third substrate split 70 is connected electrically and mechanically with the second substrate split 12 via said another joint member 13 at a joint portion JP2, which is an end away from a joint portion JP1 where the first substrate split 11 is joined. The circuit substrate 10 shown in FIG. 18 does not have any difference from the other embodiments described above, in its joint structure provided via the joint member 13 as well as in the method of manufacture. However, in terms of the final state of product, it is bent at two joint portions JP1, JP2. According to this embodiment, four or more substrate splits can be connected via additional joint members 13, as long as the structure does not pose a problem such as laborious complexity when assembling into a case for example.

According to this circuit substrate 10, a large number of the substrate splits 11, 12, 70 are collectively joined via a plurality of the joint members 13. Therefore, at each of the joint portions JP1, JP2, flexible bending is possible via the joint member 13. As a result, accommodating space within the case 1 can be effectively used, leading to an advantage of a reduced outer dimension of the battery pack P.

Figure 19:
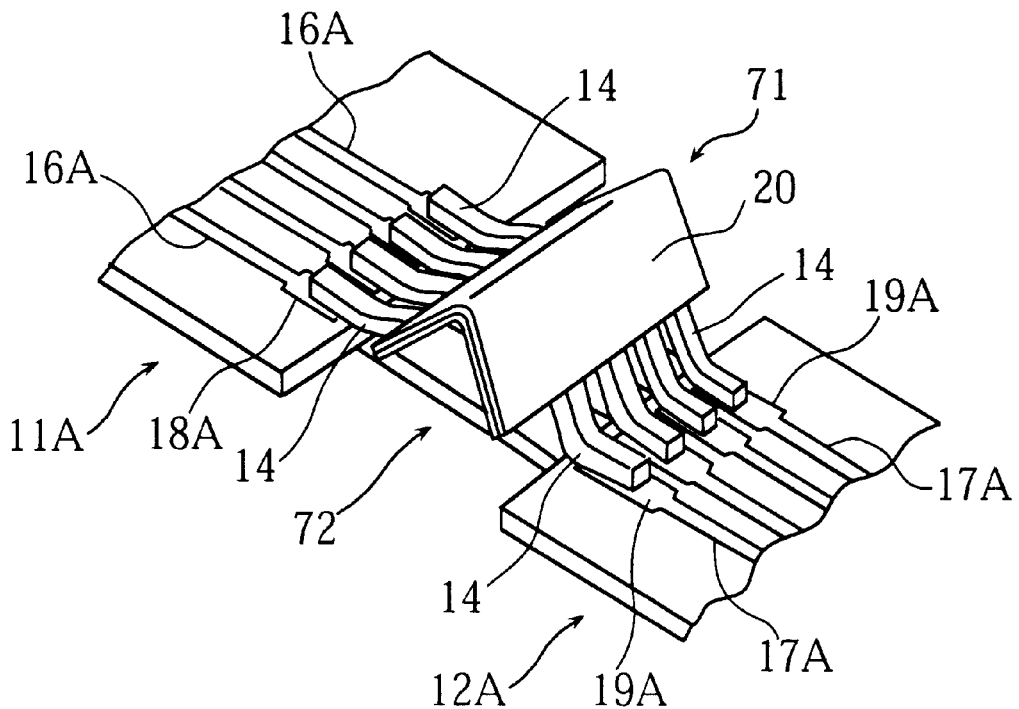
FIG. 19 is a simplified plan view showing a principal portion of a circuit substrate according to a fifth embodiment of the present invention.
Figure 20:
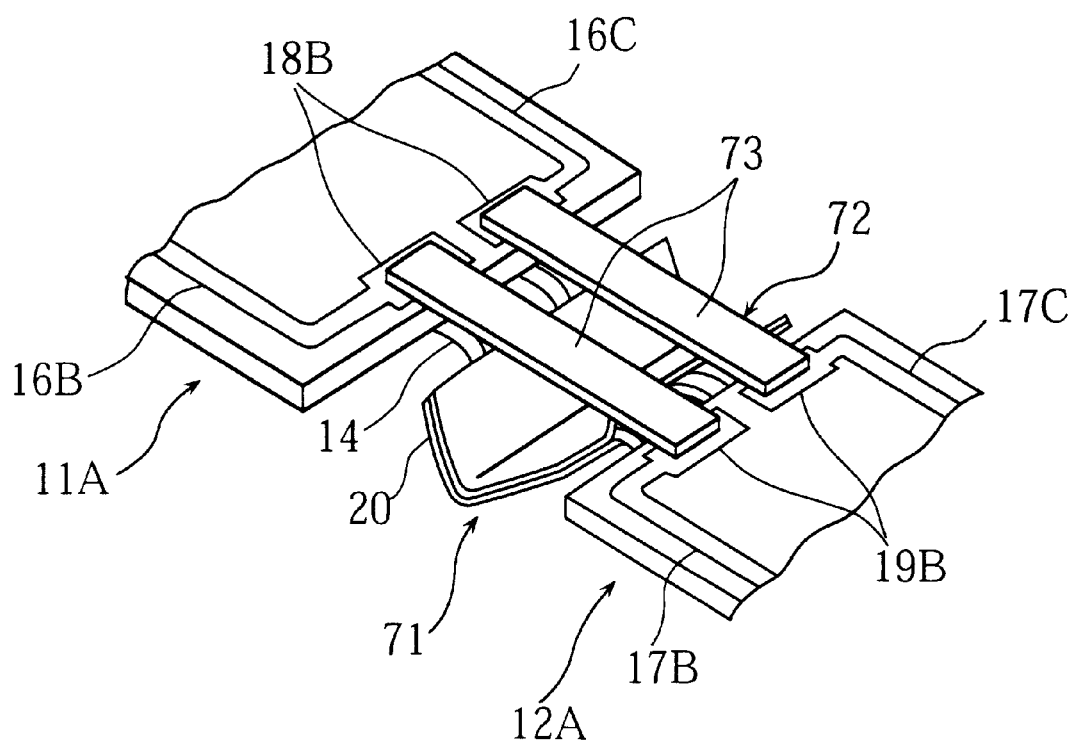
FIG. 20 is a perspective view showing a principal portion of the circuit substrate shown in FIG. 19.
Figure 21:
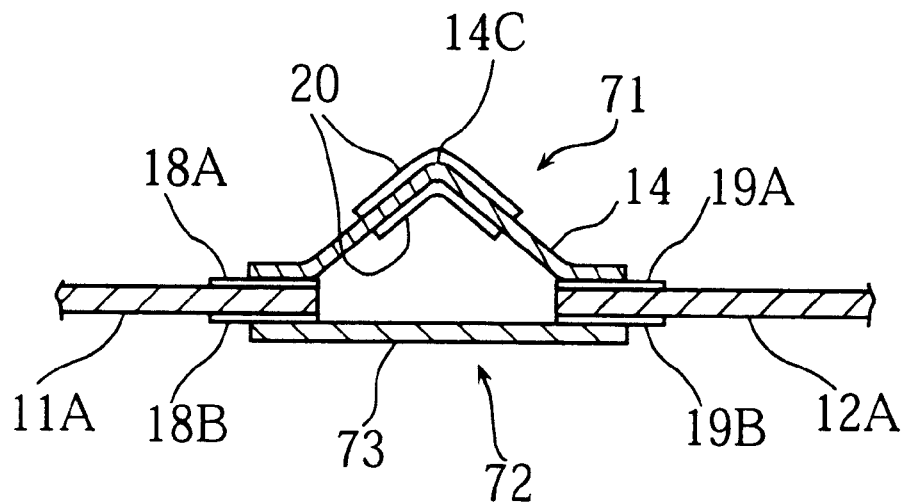
FIG. 21 is a sectional view showing a principal portion of the circuit substrate shown in FIG. 19.

FIGS. 19 through 21 show a fifth embodiment of the present invention. A circuit substrate according to the present embodiment comprises a first substrate split 11A, a second substrate split 12A, and further a first bendable jointer 71 and a second bendable jointer 72, each for electrically and mechanically connecting the substrate splits.

As shown in FIG. 19, the first and the second substrate splits 11A, 12A have upper surfaces respectively formed with a predetermined wiring patterns 16A, 17A for passing a control signal of a relatively small amperage. Each upper surface of the substrate splits 11A, 12A has an end portion formed with an appropriate number of terminals 18A, 19A of the respective wiring patterns 16A, 17A. As will be described later, the terminals 18A, 19A are to be connected with a corresponding one of the leads 14 of the first jointer 71.

The first jointer 71 is essentially the same as the joint member 13 already described above. The first jointer 71 includes a plurality of leads 14 disposed in parallel which are held by and integrally with a thin piece of base film 20. A difference, however, from the joint member 13 is that each of the leads 14 in the first jointer 71 is, as shown in FIG. 19 and FIG. 21, has its intermediate portion 14c bent to form a ridge with respect to the upper surfaces of the first and the second substrate splits 11, 12, like a mountain as viewed in a side view. Specifically, the first jointer 71 is longer than the second jointer 72. In other words, the first jointer 71 has its intermediate portion bent to be spaced from the second jointer 72 at a predetermined distance. Such a structure was induced from attempts for convenience in bending each of the joint members 71, 72 when incorporating the circuit substrate 10 into the battery pack P.

When sandwiched between the films 21, 22, each of the leads 14 has its end portions 14a, 14b exposed. The exposed end portions 14a, 14b of the lead 14 is bonded to the respective terminals 18A, 19A of the substrate splits 11A, 12A. In other words, the first jointer 71 is disposed to join respective upper surfaces of the first and the second substrate splits 11, 12.

With the above arrangement, if the control signal is sent via the wiring pattern 16A of the first substrate split 11A for example, the control signal is passed via the leads 14 and through the wiring pattern 17A of the second substrate split 12A. As described, the leads 14 of the first jointer 71 are dedicated to the control signal.

On the other hand, as shown in FIG. 20, the first and the second substrate splits 11A, 12A have lower surfaces respectively formed with predetermined wiring patterns 16B, 16C, 17b, 17C. These wiring patterns 16B, 16C, 17B, 17C serve for a power voltage signal for driving ICs and other components mounted on the upper surfaces of the substrate splits 11A, 12A. For example, the wiring patterns 16B, 17B serve as a Vcc line for power voltage signal. The wiring patterns 16C, 17C serves as a GND line for the power voltage signal. Each of the wiring patterns 16B, 16C, 17B, 17C is formed with an appropriate number of terminals 18B, 19B.

As shown in FIG. 20, the second jointer 72 includes two connecting strips 73 each made of nickel and shaped like a plate. Each of the connecting strips 73 bridges between the substrate splits 11A, 12A, with ends of the strip bonded to respective terminals 18B, 19B of the substrate splits 11A, 12A. Specifically, each of the power voltage signal Vcc line and the GND line is served by a dedicated one of the connecting strips 73. More specifically, the second jointer 72 is disposed to connect respective lower surfaces of the substrate splits 11A, 12A. Further, differing from the first jointer 71, each of the connecting strips 73 of the second jointer 72 is flat, not bent at its intermediate portion.

As described, the second jointer 72 provided by the connecting strips 73 is simpler than the first jointer 71 in which a plurality of leads 14 are sandwiched between the films 21, 22. Thus, it becomes possible to reduce parts cost and/or manufacturing cost.

According to the above arrangement, for example, the power voltage signal sent via the wiring patterns 17B, 17C of the second substrate splits 12A is passed through the wiring patterns 16B, 16C of the first substrate splits 11A. As described, the connecting strips 73 of the second jointer 72 is dedicated to the power voltage signal.

According to the arrangement described as above, the first and the second jointers 71, 72 are connected to end portions respectively of the upper and the lower surfaces of the substrate splits 11A, 12A. Therefore, a substantially greater number of wirings can be provided in the entire joint members 71, 72 than in a case in which the joint is provided only by the joint member 14. Further, it becomes possible to increase electric current capacity in the jointers 71, 72 as a whole. Further, if a relatively high amperage of power voltage signal is passed in the signal transmission between the substrate splits 11A, 12A, there is no need for increasing the size of the jointers 71, 72. Still further, the above arrangement allows favorable transmission of electric signals without need for increasing the number of wirings per each of the jointers 71, 72.

According to the above arrangement, each of the jointers 71, 72 carries a specific type of electric signal such as power voltage signal and control signal. In other words, the jointers 71, 72 are connected respectively to the upper and the lower surfaces of the substrate splits 11A, 12A. This means that the path for the control signal is disposed separately from the other jointer that serves as the path for the power voltage signal. Therefore, it becomes possible to greatly reduce adverse influence of noise for example, from the power voltage signal to the control signal, and to offer a highly reliable circuit substrate 10.

As has been described earlier, the first jointer 71 is longer than the second jointer 72. Specifically, the first jointer 71 has its intermediate portion bent to be spaced from the second jointer 72 at a predetermined distance.

Figure 22:
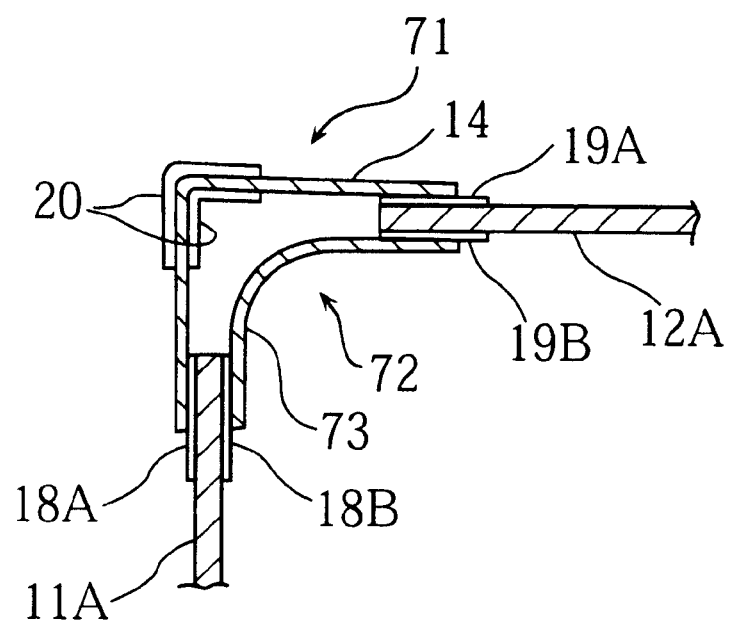
FIG. 22 is a sectional view showing a principal portion of the circuit substrate shown in FIG. 19.

With this structure, when the circuit substrate 10 as a whole is bent, as shown in FIG. 22, the two jointers 71, 72 are spaced from each other at a predetermined distance. The first jointer 71 can be bent reasonably naturally, enfolding the second jointer 72 from outside. Further, the first jointer 71 is formed like a ridge, and when bent, the first jointer 71 deforms into a projection extending beyond each of the substrate splits 11A, 12A. As a result, when the circuit substrate 10 is bent and incorporated into the case 1, the first jointer 71, which is bent, appropriately fit along a corner portion of the case 1. Therefore, internal space of the case 1 can be used effectively.

Next, a method of manufacturing the circuit substrate 10 according to the fifth embodiment will be described. The method is generally the same as of the circuit substrate 10 according to the first embodiment. For this reason, the following description will primarily focus on differences. Each of the first and the second substrate splits 11A, 12A of the circuit substrate according to the fifth embodiment is provided by a common, rigid printed circuit substrate. The first and the second substrate splits 11A, 12A has their respective upper and lower surfaces formed with respective wiring patterns 16B, 16C, 17B, 17C.

Like the joint member 13 already described, the first jointer 71 is made from a long ribbon of conductive frame 40. Tapes of films 21, 22 are attached from above and below to the conductive frame 40.

Figure 23:
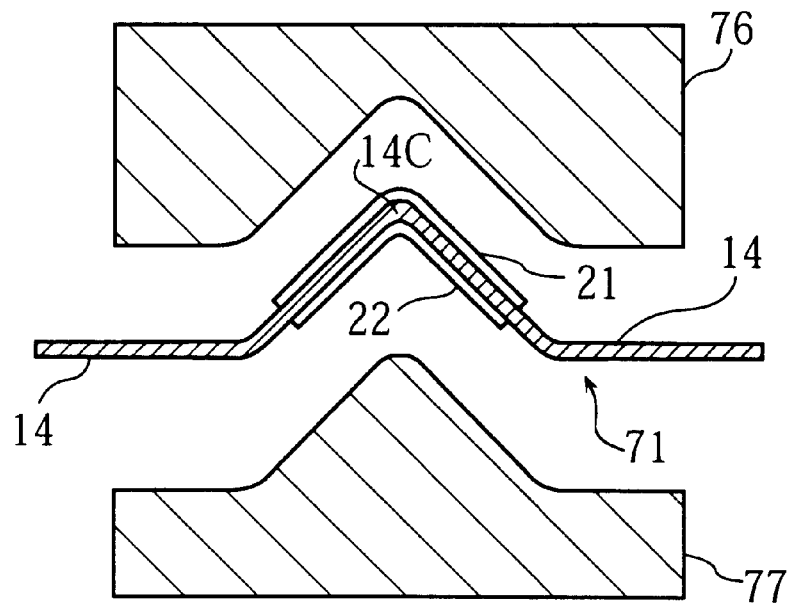
FIG. 23 is a sectional view showing a manufacturing step of a joint member shown in FIG. 19.

Next, an intermediate portion 14c of the leads 14 and an outer portion of the base film 20 are bent by using a pair of metal molds 76, 77 as shown in FIG. 23, to form the leads 14 into a ridge-like shape. Then, the conductive frame 40 is cut along its longitudinal direction and along a direction perpendicular thereto, yielding individual pieces each serving as the first jointer 71.

Figure 24:
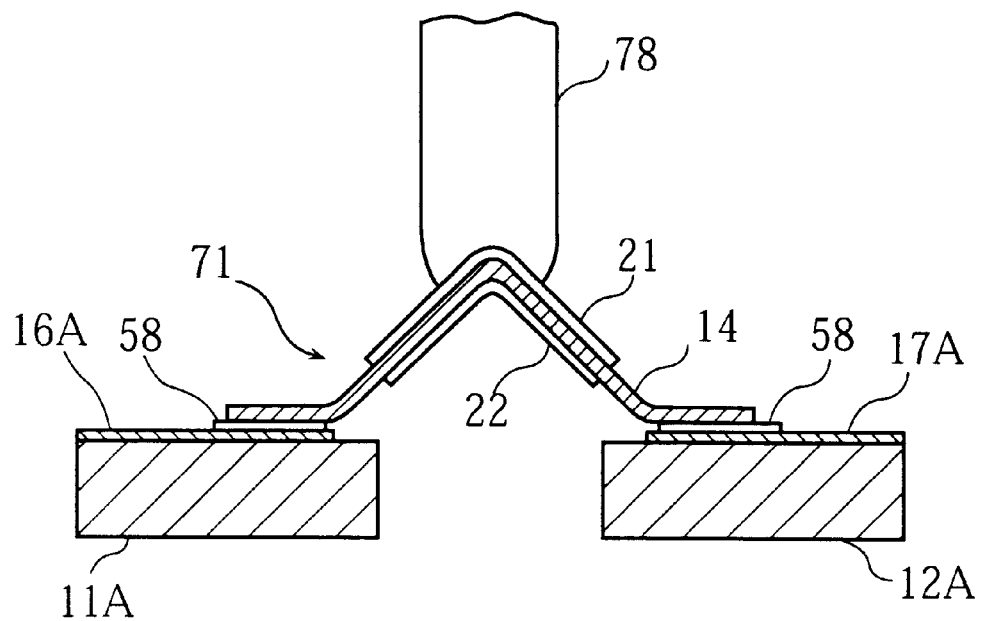
FIG. 24 is a sectional view showing a manufacturing step of the joint member shown in FIG. 19.

In manufacture of the second jointer 72, two pieces of the connecting strips 73 each made of nickel are prepared. After manufacturing the first jointer 71 as an individual piece, the first and the second jointers 71, 72 are connected to the first and the second substrate splits 11, 12. Specifically, as shown in FIG. 24, the first jointer 71 is sucked and moved by a vacuum suction collet 78, and the terminals 18A, 19A of the respective substrate splits 11A, 12A are soldered to respective end portions 14a, 14b of the leads 14.

Figure 25:
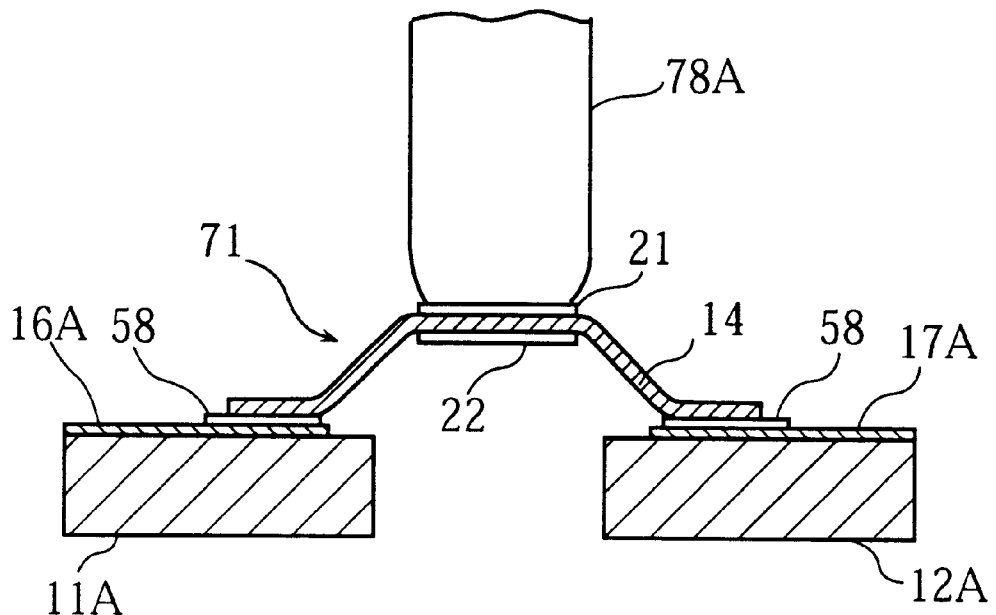
FIG. 25 is a sectional view showing a manufacturing step of the joint member shown in FIG. 19.
Figure 26:
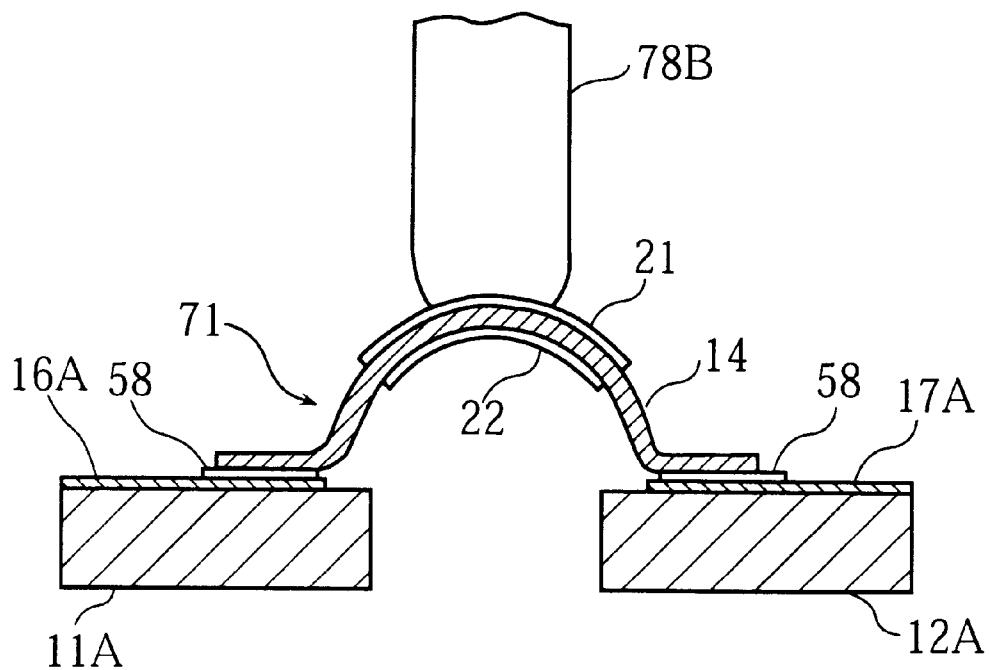
FIG. 26 is a sectional view showing a manufacturing step of the joint member shown in FIG. 19.

The suction collet 78 is provided with a nozzle specifically manufactured to fit the shape of the first jointer 71. As shown in FIG. 25 and FIG. 26, if the first jointer 71 has a generally trapezoidal shape, or generally semicircular shape, a corresponding one selected from the vacuum suction collets 78A, 78B each having a different nozzle is used. As described, by using the vacuum suction collet 78 provided with a nozzle to fit a specific shape of the joint member 13 when connecting the first jointer 71 to the substrate splits 11A, 12A, mounting operation of the joint member can be automated.

Once the first jointer 71 is connected to the substrate splits 11A, 12A, the substrate splits 11A, 12A are turned over, and the second jointer 72 is connected to the substrate splits 11A, 12A.

Figure 27:
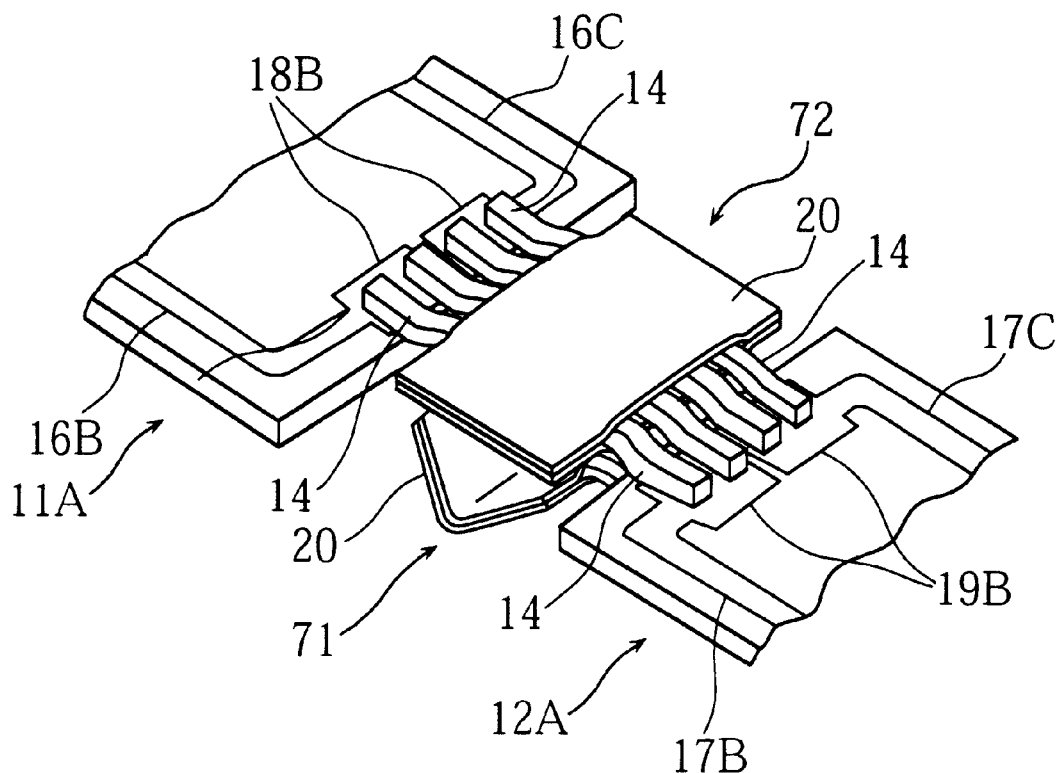
FIG. 27 is a perspective view showing a principal portion of a circuit substrate according to a sixth embodiment of the present invention.

FIG. 27 illustrates a circuit substrate according to a sixth embodiment of the present invention. According to this circuit substrate, the second jointer 72 includes, as the first jointer 71, a plurality of leads 14 disposed in parallel to each other and held between the thin pieces of films 21, 22 integrally therewith. The end portions 14a, 14b of each lead 14 are bonded respectively to the terminals 18b, 19B of the substrate splits 11A, 12A. Specifically, according to the referenced figure, two leads 14 are used for each of the power voltage signal Vcc line and GND line.

Figure 28:
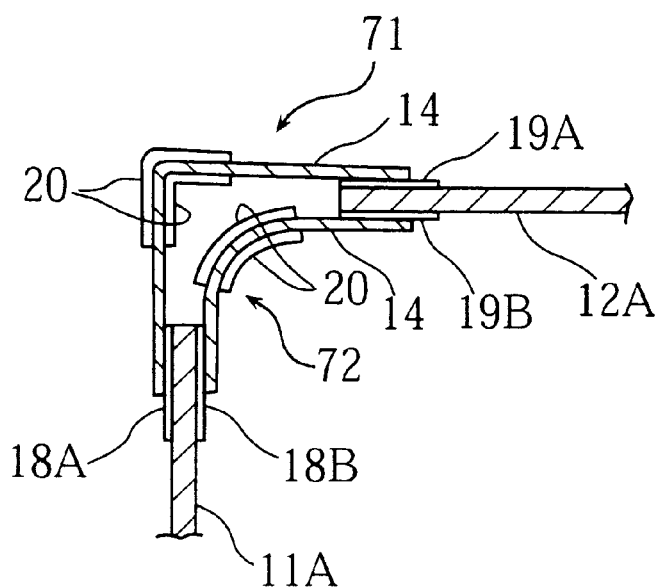
FIG. 28 is a sectional view showing a principal portion of the circuit substrate shown in FIG. 27.

The first jointer 71 is longer than the second jointer 72. Therefore, according to the circuit substrate 10 with this arrangement, when the first and the second jointers 71, 72 are bent, as shown in FIG. 28, the first jointer 71 can be bent reasonably naturally, enfolding the second jointer 72 from outside.

In the arrangement such as the above, in which the first and the second jointers 71, 72 have the same structure, the paths for the control signal and the power voltage signal may be swapped each other. Specifically, the first jointer 71 may be dedicated to the power voltage signal and the second jointer 72 may be dedicated to the control signal. In this case however, the wiring patterns 16B, 16c, 17B, 17C formed on the substrate splits 11A, 12A must also be swapped to appropriately serve for the control signal and the power voltage signal. Alternatively, the power voltage signal and the control signal may be passed through the same jointer(s) 71, 72.

The circuit substrate 10 thus completed with the first and the second substrate splits 11A, 12A and the first and the second jointers 71, 72, is incorporated into the battery pack P as shown in FIG. 29. It should be noted that the first jointer 71 may be varied in its shape and/or size to fit a specific shape of the battery pack P. For instance, if the case 1 has a rounded corner, a semi-circular joint 71 as shown in FIG. 26 may be made to fit to the case 1.

What is claimed is:

1. A circuit substrate comprising a first substrate split formed with a predetermined wiring pattern, a second substrate split formed with a predetermined wiring pattern, and a joint member which is bendable at least centrally for electrically and/or mechanically joining the substrate splits together, wherein the joint member includes a pair of outer layers, a plurality of leads disposed in parallel between the outer layers and joining the first and the second substrate splits, and a retainer formed between the outer layers for retaining the leads integrally therewith, and wherein the retainer is provided by an adhesive filling a space between the leads between the outer layers, the adhesive being thermally melted and then set.

2. The circuit substrate according to claim 1, wherein the leads are shaped in a gull wing pattern, the attachment of the joint member being provided by each of the leads having its two ends connected to predetermined positions respectively of the substrate splits.

3. The circuit substrate according to claim 1, wherein the first and the second substrate splits are electrically interconnected via the leads.

4. The circuit substrate according to claim 1, wherein the first and the second substrate splits are rigid printed wiring substrates.

5. The circuit substrate according to claim 1, wherein the bonding layer is provided by a silicone adhesive or an epoxy adhesive.

6. The circuit substrate according to claim 1, wherein each of the leads has its end portions, except end faces, soldered to terminals of the substrate splits.

7. The circuit substrate according to claim 6, wherein each of the leads has end portions bent to be oriented upward.

8. The circuit substrate according to claim 1, wherein each of the leads has at least one narrower portion and at least one wider portion.

9. The circuit substrate according to claim 1, wherein the first and/or the second substrate splits are joined with still another substrate split via another joint member.

10. A circuit substrate comprising a first substrate split formed with a predetermined wiring pattern, a second substrate split formed with a predetermined wiring pattern, and a joint member which is bendable at least centrally for electrically and/or mechanically joining the substrate splits together, wherein the joint member includes a first jointer joining the substrate splits on their respective upper surfaces and a second jointer joining the substrate splits on their respective lower surfaces, wherein the first jointer includes a pair of outer layers, a plurality of leads disposed in parallel between the outer layers and joining the first and the second substrate splits, and a retainer formed between the outer layers for retaining the leads integrally therewith, and wherein the retainer is provided by an adhesive filling space between the leads between the outer layers, the adhesive being thermally melted and then set.

11. The circuit substrate according to claim 10, wherein the first jointer is longer than the second jointer.

12. The circuit substrate according to claim 10, wherein the first jointer has an intermediate portion bent to be spaced from the second jointer at a predetermined distance.

13. The circuit substrate according to claim 10, wherein at least the second jointer includes a plurality of connecting strips disposed in parallel to each other.

14. The circuit substrate according to claim 10, wherein each of the jointers is dedicated to a specific kind of electric signal.

15. The circuit substrate according to claim 10, wherein one of the jointers carries a power voltage signal and the other of the jointers carries a control signal that differs from the power voltage signal.

16. A battery pack comprising a circuit substrate comprising a first substrate split formed with a predetermined wiring pattern, a second substrate split formed with a predetermined wiring pattern, and a joint member which is bendable at least centrally for electrically and/or mechanically joining the substrate splits together, the circuit substrate being connected with a battery and incorporated in a case, wherein the joint member includes a pair of outer layers, a plurality of leads disposed in parallel between the outer layers and joining the first and the second substrate splits, and a retainer formed between the outer layers for retaining the leads integrally therewith, wherein the retainer is provided by an adhesive filling space between the leads between the outer layers, the adhesive being thermally melted and then set, and wherein the circuit substrate incorporated in the case is bent at the joint member, yielding to the battery.

17. A method of manufacturing a circuit substrate comprising a first substrate split formed with a predetermined wiring pattern, a second substrate split formed with a predetermined wiring pattern, and a joint member which is bendable at least centrally for electrically and/or mechanically joining the substrate splits together, the method comprising:

a joint member making step of first sandwiching a plurality of leads disposed in parallel at a predetermined interval between a pair of films, each of the films including an outer layer and an adhesive layer formed on the outer layer, the leads being sandwiched between the adhesive layers of the films, and then thermally melting and thereafter solidifying the adhesive layers that sandwich the leads; and a joint member attaching step of first placing the first and the second substrate splits closely to each other, and then connecting end portions of each lead to predetermined positions respectively of the first and the second substrate splits.

18. The method according to claim 17, wherein the leads are deformed into a gull wing pattern after the adhesive layers have been solidified, in the joint member making step, and wherein the ends of each lead are aligned with the respective predetermined positions of the substrate splits for the connection, in the step of attaching the joint member.

19. The method according to claim 17, wherein the joint member making step includes: preparing an electrically conductive long frame formed with a pattern of a slit group continually in a longitudinal direction, the slit group including a plurality of slits leaving portions to serve as the plurality of leads; pasting the films in the longitudinal direction to sandwich part of each slit group; thermally melting and then solidifying the adhesive layers; and then cutting out the lead, thereby obtaining a plurality of joint members.

20. The method according to claim 17,
wherein the joint member making step includes:
forming a recess having a generally V-shaped section at each end portion of the lead; and bending a portion of the lead which is inward of each recess; and
wherein the joint member attaching step includes:
connecting each bent portion to a terminal in corresponding one of the substrate splits; and thereafter cutting the lead at the recess.

21. A method of manufacturing a circuit substrate comprising a first substrate split formed with a predetermined wiring pattern, a second substrate split formed with a predetermined wiring pattern, and a joint member which is bendable at least centrally for electrically and/or mechanically joining the substrate splits together, the joint member including a first jointer joining upper surfaces respectively of the substrate splits, and a second jointer joining lower surfaces respectively of the substrate splits, the method comprising:

a first jointer making step of first sandwiching a plurality of leads disposed in parallel at a predetermined interval between a pair of films, each of the films including an outer layer and an adhesive layer formed on the tape layer, the leads being sandwiched between the adhesive layers of the films, then thermally melting and thereafter solidifying the adhesive layers that sandwich the leads, and thereafter bending the leads at their intermediate portion;

a first jointer attaching step of first placing the first and the second substrate splits closely to each other, and then connecting end portions of each lead to predetermined positions on the upper surfaces respectively of the first and the second substrate splits; and a second jointer attaching step of connecting a plurality of connecting strips as the second jointer, in parallel to each other to predetermined positions on the lower surfaces respectively of the first and the second substrate splits.

* * * * *